US012808937B2

(12) United States Patent
Wang et al.

(10) Patent No.: US 12,808,937 B2
(45) Date of Patent: Nov. 24, 2026

(54) MODEL PREDICTIVE CONTROLLER ARCHITECTURE AND METHOD OF GENERATING AN OPTIMIZED ENERGY SIGNAL FOR CHARGING A BATTERY

(71) Applicant: Iontra Inc, Centennial, CO (US)

(72) Inventors: Zhong Wang, Sugar Land, TX (US); John Richard Howlett, III, Centennial, CO (US); Daniel A. Konopka, Denver, CO (US); Ruzhou Yang, Hayward, CA (US); Lang Xia, Boyds, MD (US)

(73) Assignee: Iontra Inc, Centennial, CO (US)

( * ) Notice: Subject to any disclaimer, the term of this patent is extended or adjusted under 35 U.S.C. 154(b) by 626 days.

(21) Appl. No.: 18/232,331

(22) Filed: Aug. 9, 2023

(65) Prior Publication Data

US 2024/0053403 A1 Feb. 15, 2024

Related U.S. Application Data

(60) Provisional application No. 63/370,908, filed on Aug. 9, 2022.

(51) Int. Cl.
*G01R 31/367* (2019.01)
*G01R 31/392* (2019.01)
*G05B 13/02* (2006.01)

(52) U.S. Cl.
CPC ......... *G01R 31/367* (2019.01); *G01R 31/392* (2019.01); *G05B 13/022* (2013.01)

(58) Field of Classification Search
None
See application file for complete search history.

(56) References Cited

U.S. PATENT DOCUMENTS

2006/0284617 A1 12/2006 Kozlowski et al.
2012/0303208 A1* 11/2012 Hariharan ............. H01M 10/48 701/32.9
2015/0288213 A1 10/2015 van Lammeren et al.
2019/0120910 A1 4/2019 Ghantous et al.
2021/0328448 A1 10/2021 Konopka et al.
2021/0367442 A1 11/2021 Konopka et al.
(Continued)

FOREIGN PATENT DOCUMENTS

EP 3546963 A1 10/2019

OTHER PUBLICATIONS

Yang, P. et al., Temperature Estimation from Current and Voltage Measurements in Lithium-Ion Battery Systems, Journal of Energy Storage, 34:102133, 2021 (8 pages).
(Continued)

*Primary Examiner* — Walter L Lindsay, Jr.
*Assistant Examiner* — Geoffrey T Evans
(74) *Attorney, Agent, or Firm* — Polsinelli PC; Derek Donahoe

(57) ABSTRACT

A model predictive controller and related charging components producing a charge signal for a battery wherein predicted battery parameters such as state of charge, battery temperature, state of health (e.g., anode overpotential), are used to generate constraints that are subsequently used, such as through an optimizer running a cost function, to produce a charge signal that may include one or more optimized charge attributes including a charge current magnitude or a mean current, a shaped leading edge, an edge time, a body time, and a rest time.

28 Claims, 18 Drawing Sheets

(56) References Cited

U.S. PATENT DOCUMENTS

| | | | |
|---|---|---|---|
| 2022/0209562 | A1 | 6/2022 | Kessner et al. |
| 2022/0221516 | A1 | 7/2022 | Lee et al. |

OTHER PUBLICATIONS

International Searching Authority, International Search Report and Written Opinion, issued for International Application No. PCT/US2023/029912, mailed Feb. 5, 2024 (13 pages).

Lee, Y. et al. "Electrochemical State-Based Sinusoidal Ripple Current Charging Control"; IEEE Transactions on Power Electronics 30(8):4232-4243, Aug. 2015.

Yan, J. et al. "Battery Fast Charging Strategy Based on Model Predictive Control"; IEEE Vehicular Technology Conference, Sep. 9, 2010.

Yin, Y. et al. "Actively Temperature Controlled Health-Aware Fast Charging Method for Lithium-Ion Battery Using Nonlinear Model Predictive Control", Applied Energy, 271:115232, Jun. 4, 2020.

Zou, C. et al. "Electrothermal Dynamics-Conscious Lithium-Ion Battery Cell-Level Charging Management via State-Monitored Predictive Control"; Energy, 141:250-259, Sep. 17, 2017.

* cited by examiner

MODEL PREDICTIVE CONTROLLER ARCHITECTURE AND METHOD OF GENERATING AN OPTIMIZED ENERGY SIGNAL FOR CHARGING A BATTERY

CROSS-REFERENCE TO RELATED APPLICATION

This application is related to and claims priority under 35 U.S.C. § 119(e) from U.S. Patent Application No. 63/370,908, filed Aug. 9, 2022, titled "Model Predictive Controller Architecture and Method of Generating an Optimized Energy Signal for Charging a Battery," the entire contents of which is incorporated herein by reference for all purposes.

TECHNICAL FIELD

Embodiments of the present invention generally relate to systems and methods for charging a battery, and more specifically to model predictive controller architectures and methods for generating a charge signal and defining various aspects of a charge signal based on various possible parameters including predicted temperature, predicted state of charge, impedance, state of health including anode overpotential, and/or various other metrics.

BACKGROUND AND INTRODUCTION

Countless different types of electrically powered devices, such as power tools, mobile computing and communication devices, portable electronic devices, and electrically powered vehicles of all sorts including scooters and bicycles, use rechargeable batteries as a source of operating power. Rechargeable batteries are limited by finite battery capacity and must be recharged upon depletion. Recharging a battery may be inconvenient as the powered device must often be stationary during the time required for recharging the battery. Depending on battery size, recharging can take hours. Moreover, battery charging is often accompanied by degradation of battery performance. As such, significant effort has been put into developing battery charging technology to reduce the time needed to recharge the battery, improve battery performance, reduce degradation of the battery from charging, among other things.

It is with these observations in mind, among others, that various aspects of the present disclosure were conceived and developed.

SUMMARY

Aspects of the present disclosure involve a controller for a battery comprising a processing unit including computer executable instructions of:

- a first model receiving a battery voltage measurement and a battery current measurement, and producing a predicted state of charge of the battery
- a second model receiving the battery voltage measurement and the battery current measurement, and producing a predicted battery temperature
- a third model receiving the battery voltage measurement and the battery current measurement, and producing a frequency based on an impedance assessment based on battery voltage measurement and the battery current measurement The processing unit further comprises computer executable instructions to generate controls for a charge signal based on the predicted state of charge of the battery, the predicted battery temperature and the frequency.

In another aspect, aspects of the present disclosure involve a controller for a battery comprising a processing unit including computer executable instructions of:

- a battery state of charge model receiving a battery parameter, and producing a predicted state of charge of the battery;
- a battery temperature model receiving the battery parameter, and producing a predicted battery temperature;
- an impedance model receiving the battery parameter, and producing a frequency based on an impedance assessment using the battery parameter.

The processing unit further comprises computer executable instructions to generate a charge signal based on the predicted state of charge of the battery, the predicted battery temperature and the frequency.

Another aspect of the present disclosure involves a method of battery charging. With a processor, the method comprises predicting a battery parameter based on a measurement of a battery attribute and a controllable charge signal parameter. The method further involves generating a constraint of the controllable charge signal parameter when the predicted battery parameter does not meet a parameter constraint. The method further involves executing a cost function based on the constraint of the controllable charge signal parameter to alter the controllable charge parameter. Finally, the method further involves generating a charge signal to charge the battery, the charge signal based on the altered controllable charge parameter.

In various aspects, the predicted battery parameter is not otherwise directly measured, the predicted battery parameter is at least one of a predicted battery temperature, a predicted anode overpotential or a predicted state of charge, and/or the predicted battery parameter is at least one of a plated-lithium concentration, a solid electrolyte interphase (SEI) thickness, an averaged negative particle crack length, or a loss of active material in the negative electrode.

In various aspects, predicting the battery parameter uses a model, the model receiving the battery attribute, wherein the battery attribute is at least one of a battery charge current, a battery voltage, a battery temperature or a state of charge. The model may be a Python Battery Mathematical Modeling model. In various possible examples, the predicting the battery parameter is further based on at least one charge signal attribute of edge time, body time, and average current.

In various aspects, generating the constraint of the controllable charge signal parameter comprises iterating a charge signal constraint using a bisection method to cause at least one of a predicted battery parameter of anode overpotential to be great than 0 volts or a predicted temperature to meet a temperature threshold. In some aspects, the controllable charge parameter further comprises at least one parameter based on edge time, body time, average current or rest time.

In various aspects, generating the charge signal includes generating a repeating sequence of charge signals, where each charge signal includes at least one of a based on at least one of edge time, body time, and average current. In other aspects, generating the charge signal includes shaping a leading edge of the repeating charge signal based on the edge time. The shaped leading edge may be based on a frequency determined from the edge time.

In one example, the cost function is:

$$J(k)=\sum_{i=1}^{N_p} w_{p_i} e_{SOC}^2(k+i)+\sum_{i=1}^{N_c} w_{c_i}(I(k+i-1)-I_{ref}(k))^2,$$

where:

$N_p$ is the MPC prediction horizon on the SOC tracking error, $N_c$ is the MPC prediction horizon on the control input, $w_{p_i}$ and $w_{c_i}$ are the weights for the SOC tracking error and the control input, respectively, and $I_{ref}(k)$ is the desired or reference current charge rate.

In another example, the cost function is:

$$J(k)=\sum_{i=1}^{N_p} w_{p_i} e_{SOC}^2(k+i)+\sum_{i=1}^{N_c}\Big(w_{cI_i}(I(k+i-1)-I_{ref}(k))^2+ w_{ccp_i}(cp(k+i-1)-\overline{cp}(k))^2+w_{cep_i}\big(ep(k+i-1)-\underline{ep}(k)\big)^2\Big),$$

where:

$N_p$ is the MPC prediction horizon on the SOC tracking error, $N_c$ is the MPC prediction horizon on the control input, $w_{p_i}$, $w_{cI_i}$, $w_{ccp_i}$ and $w_{cep_i}$ are the weights for the SOC tracking error and the control inputs, respectively, and $I_{ref}(k)$ is the desired or reference current charge rate.

BRIEF DESCRIPTION OF THE DRAWINGS

The various objects, features, and advantages of the present disclosure set forth herein will be apparent from the following description of embodiments of those inventive concepts, as illustrated in the accompanying drawings. It should be noted that the drawings are not necessarily to scale and may be representative of various features of an embodiment, the emphasis being placed on illustrating the principles and other aspects of the inventive concepts. Also, in the drawings the like reference characters may refer to the same parts or similar throughout the different views. It is intended that the embodiments and figures disclosed herein are to be considered illustrative rather than limiting.

DETAILED DESCRIPTION

The system may be considered a model predictive controller for determining and generating an optimal charge signal for charging a battery. The system is also beneficial for characterizing batteries, characterizing and developing battery charging and discharging signals for new battery sizes, chemistries and the like. One advantage of the model predictive controller architecture described herein is that it is suitable for acting on multiple inputs, generating multiple outputs, when either or both are needed in any given implementation, charging signal generation or battery characterization scenario. For example, the system may act on a voltage, current and temperature at the battery. The system may also act on computed values or derived values such as impedance, or aspects of impedance such as the real or imaginary components of impedance. Depending on the charge situation and/or the implementation, another advantage of the model predictive battery charge architecture described herein, is that the output parameters of the battery during charge (e.g., terminal voltage, input charge current, and or temperature) may be controlled to follow a reference output. For example, the system may include various possible reference profiles and the model predictive controller may control the charge waveform such that the actual battery performance during charge matches or otherwise follows the reference profile for any given charge.

Using the techniques described herein, the system may further generate optimal charge parameters, which may include optimal harmonic attributes mapped or otherwise related to impedance or other deleterious effects in the battery, to meet the profile. Conventional charging scenarios, including constant current constant voltage charging or variations of the same involve charging at some constant current and/or holding some terminal voltage constant while under charge in which case the charge current is typically reduced until it is zero. In these conventional charging scenarios, there is simply no need for a complicated charging architecture, or for any sophisticated architecture useful in optimizing a charge signal based on some starting arbitrarily shaped charge signal.

Another aspect of the present disclosure involves a user interface by which different charge attributes may be set in the system or otherwise configured, and for which the system may determine and/or optimize a charge signal. For example, by way of a user interface, a charge rate, safe operating temperature limit, maximum terminal voltage, and/or other parameters may be set in the system, and the system automatically iterates to an optimal charge waveform to meet those conditions. The model predictive controller architecture may then run that charge waveform and adjust that waveform to meet the user set charge parameters. The system may also facilitate prioritizing different parameters.

Figure 1:
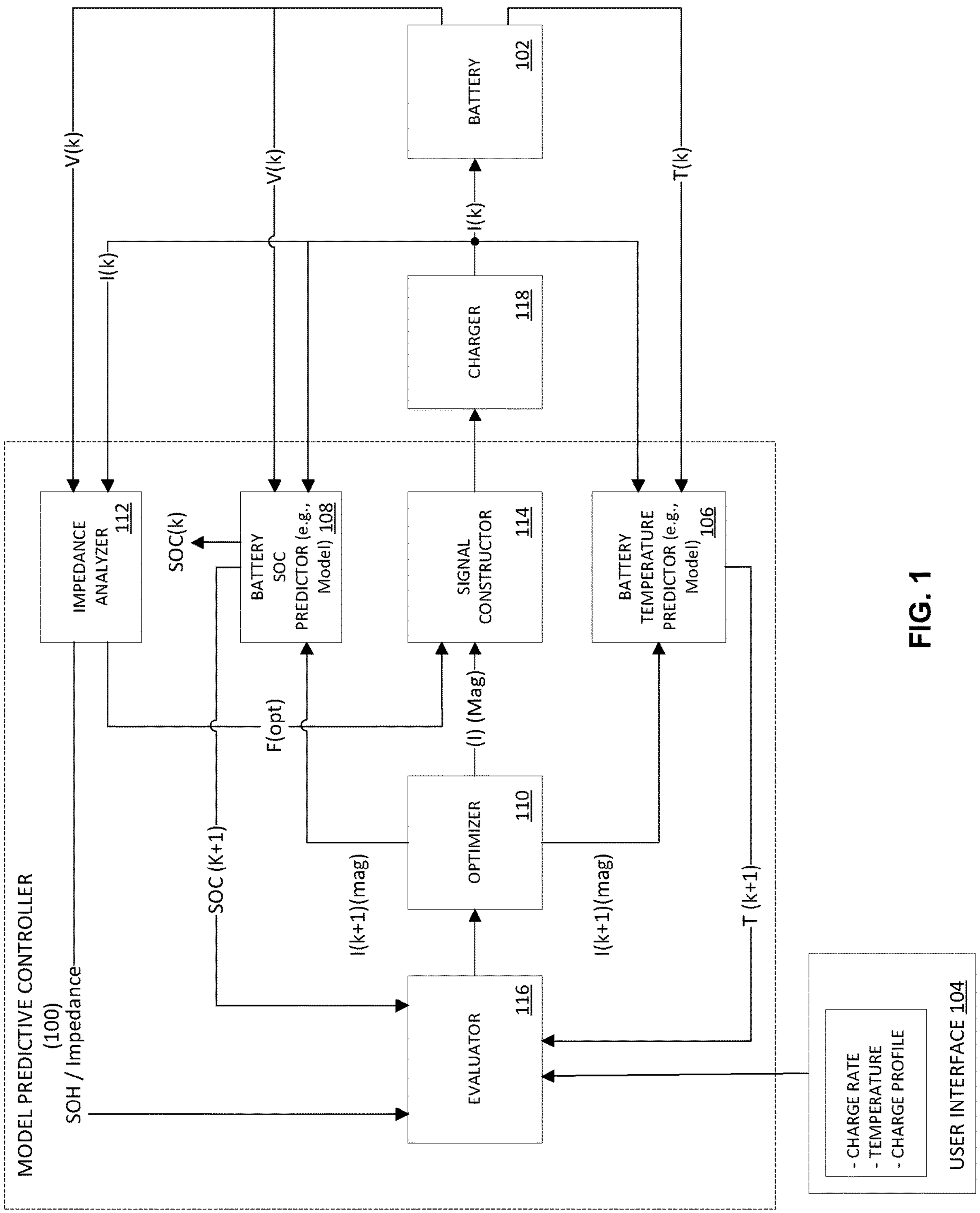
FIG. 1 is a system diagram of a model predictive controller and an associated battery system in accordance with one embodiment.

Referring now to FIG. 1, a model predictive controller (MPC) architecture 100 involved in charging and/or generating an optimal charge signal for charging a battery 102 is shown. In this example, the MPC system generates a charge current waveform that is applied to the battery to charge the battery. The system may monitor, and in some examples use in optimization generation, various battery attributes while charging including terminal voltage, battery temperature and the input current waveform. The system may further monitor, and use in optimization, other parameters like charge rate and impedance.

The term "battery" in the art and herein can be used in various ways and may refer to an individual cell having an anode and cathode separated by an electrolyte, solid or liquid, as well as a collection of such cells connected in various arrangements. A battery or battery cell is a form of electrochemical device. Batteries generally comprise repeating units of sources of a countercharge and electrode layers separated by an ionically conductive barrier, often a liquid or polymer membrane saturated with an electrolyte. These layers are made to be thin so multiple units can occupy the volume of a battery, increasing the available power of the battery with each stacked unit. Although many examples are discussed herein as applicable to a battery, it should be appreciated that the systems and methods described may apply to many different types of batteries ranging from an individual cell to batteries involving different possible interconnections of cells such as cells coupled in parallel, series, and parallel and series. For example, the systems and methods discussed herein may apply to a battery pack comprising numerous cells arranged to provide a defined pack voltage, output current, and/or capacity. Moreover, the implementations discussed herein may apply to different types of electrochemical devices such as various different types of lithium batteries including but not limited to lithium-metal and lithium-ion batteries, lead-acid batteries, various types of nickel batteries, and solid-state batteries of various possible chemistries, to name a few. The various implementations discussed herein may also apply to different structural battery arrangements such as button or "coin" type batteries, cylindrical cells, pouch cells, and prismatic cells.

The architecture described herein may be used to control battery charging in a variety of discrete applications ranging from mobile computing devices such as mobile phones and tablets, may be deployed in a variety of power tools, may be deployed in various vehicles ranging from bikes and scooters to larger vehicles such as cars. The present architecture may also be used in developing charge profiles and/or testing various charge profiles to meet various charge specifications including charge rate, which may be associated with the amount of time it takes to charge a battery to various states of charge, maximum charge current, charge waveform current amplitude (max), battery temperature, battery health, and battery capacity among other features.

In the system illustrated in FIG. 1, a user interface (UI) 104 is provided where a user can specify a variety of charge attributes that are used by the architecture to generate a charge waveform to apply to the battery. In various examples, such a system with a user interface may be useful to create different charge profiles, test and optimize charge profiles, and do so against a myriad of different existing or to be developed battery chemistries and configurations. In general, an advantage of the architecture is that constraints may be defined, and the system may select or generate a charge waveform based on those constraints, while monitoring and adjusting the performance of the same. Moreover, priorities may be defined for the various constraints.

The system may incorporate constraints on the inputs, outputs, as well as rate of change of inputs and outputs. The constraints may come from physical limitations (e.g., the maximum input current available to the charging system, the maximum charge current to the battery, current limitations imposed from a charge circuit topology, etc.), defined or specified limitations (e.g., minimum temperature for charging to occur, maximum temperature limit during a charge process, etc.).

The system, through the user interface or otherwise, may prioritize various constraints. In one example, it is possible to establish 'soft' and 'hard' constraints. For example, a user interface may allow a user to select a constraint through a drop down menu, establish a parameter (e.g., a value) or parameters for the constraints, and select whether the constraint is a hard or soft constraint. A hard constraint is one that cannot be violated whereas soft constraints can be violated. For example, a constraint may be an operating temperature range or a discrete lower temperature constraint and upper temperature constraints, with a lower temperature limit value (parameter) being a soft constraint and an upper limit being a hard constraint such that charging may not occur above the upper limit, but charging may occur below the lower limit, if other hard constraints are met and optimizing otherwise indicates charging to occur. As such, when hard and soft constraints are defined, during optimization by the system and when there is conflict between constraints, the soft constraints may be violated, the hard constraints cannot be violated, and the system will minimize violation of the soft constraints.

The system also allows for weighting of constraints. In various possible situations, various goals may be prioritized through weighting. In a simple example, the system may address both battery longevity and fast charging, which in some cases may conflict where fast charging comes at the expense of battery longevity. While the system may optimize both in unexpected ways, in some cases a user may prioritize one of the other for any given implementation. For example, a user may prioritize charge speed over battery longevity, in which case a time to charge or other such constraint may receive a higher weight than a battery longevity constraint. Thus, the system may balance performance between goals through weighting constraints. The optimizer will tend to achieve the constraints with heavier weights more often than those with lesser weights but will nonetheless attempt to achieve them all.

The MPC architecture includes a temperature predictor model 106. The temperature predictor model may receive (as inputs) the battery temperature T(k), the input current I(k), and/or the battery voltage V(k). The measured values T(k), I(k), and V(k) may, when analyzed by the temperature predictor model, represent values at some time (k−1) prior to the current time. The model predicts the temperature at some point in the future (e.g., K+1) based on the measured value inputs. The model may be implemented in various possible forms including an empirical or other form of equation, a lookup table, a machine learning model, a neural network, and other forms of models that receive inputs of the current state of the system to produce a predicted temperature of the battery at some point in the future.

In one specific example, the system predicts a temperature change (e.g., rise) based on the existing charge waveform including the current (I) and voltage (V) components thereof. It should be recognized that the temperature predictor model, as well as other models herein, may receive the charge waveform values and battery temperature measurements over some period of time (e.g., a history of measurements) average of measurement, mean, min or max of measurement, and use the collective values to predict a future battery temperature T(k+1). The predicted temperature may be at some point in the future, which may be as early as the next measurement time where the system will assess conditions and possibly modify the charge waveform, or some other time in the future. One use of the predicted temperature by the MPC is to generate a charge waveform that does not cause the battery to exceed some temperature threshold, which may be a constraint, or go outside a temperature profile defined in the system at the evaluator by way of the UI or otherwise. In another example, the system may generate a charge signal with a relatively high charge rate that will not cause the battery temperature to exceed some temperature and/or minimize degradation of SOH, among other considerations.

The MPC architecture may further include a state of charge (SOC) predictor model 108. The SOC model may receive the charge waveform at the battery, which may include discrete battery voltage V(k) and charge current I(k) measurements as inputs. Using the inputs, the SOC model may generate a current state of charge (SOC(k)). The SOC model may further generate or otherwise predict a state of charge (e.g., SOC(k+1)), at some point in the future, based on the inputs. The current state of charge may also be an input into the model to predict the future state of charge.

In many instances, the time or cycle for the predicted temperature and the predicted state of charge are aligned. So, if the model predicts the temperature at some time k(n) in the future, the state of charge will be predicted at the same time k(n) in the future.

From the SOC predictor 108 and the battery temperature predictor 108, the system has a predicted state of charge (SOC(k+1)) and a predicted temperature (T(k+1)) of the battery based on the charge waveform, e.g. values I(k) and V(k), currently being applied to the battery 102, as well as other information such as temperature T(k). The SOC and Temperature predictor may also receive the magnitude of the current, which may be a mean current value, from an optimizer 110 as discussed in more detail below.

The predictive controller architecture may further include an impedance analyzer 112. The inputs to the impedance analyzer are the current charge current I(k) and the terminal voltage V(k) in the presence of the charge current, as well as previous measurements of both values I(k−1), I(k−2), I(k−n) and V(k−1), V(k−2), V(k−n) forming current and voltage waveforms over time. From the battery voltage and charge current measurements, the impedance analyzer determines the impedance of the battery to the charge signal I(k) being applied to the battery. The charge signal I(k) is discussed based on its current value as in some instances it is a current controlled value, while recognizing that it has a voltage value that is measured and referred to as V(k).

In one specific arrangement, the impedance analyzer 112 may generate an impedance spectrum for the battery. Using the impedance spectrum, the impedance analyzer may identify F(opt), whit may be frequency (F) or frequencies, or frequency bandwidth, at which the impedance is the lowest value or otherwise relatively low to other values and provide that frequency parameter to a signal constructor 114, discussed in more detail below. The output (e.g., F(opt)) provided to the signal constructor, may thus be a discrete frequency value, frequency values, or a frequency bandwidth. The generated frequency or frequencies, or frequency bandwidth, may also be associated with relatively minimal plating within the battery. Plating or deposition of lithium on the anode has various deleterious effects on a battery including removing lithium available for intercalation, forming discontinuities reducing charge distribution and non-uniformity, and forming dendrites, any of which alone or in combination contribute to battery health degradation. In one possible implementation, the impedance analyzer may include one or more models that generate the frequency or frequencies or frequency bandwidth for relatively low plating, which may alone or in combination also reference to relative magnitude of the impedance of any specific frequency as compared to others. The frequency or frequencies of the relatively low impedance may be the same as that associated with no or relatively minimal plating. In some examples, the frequency associated with minimal plating may not necessarily be the same as that associated with the lowest impedance. In part, the signal constructor may use the frequency of frequencies to define aspects of the charge signal.

In various aspects and referring to FIG. 2, a charge signal 200 generated by the signal constructor may include a shaped leading edge 210, a body portion 220 and a rest portion 230. The shape of the leading edge may be that of a sinusoid (portion thereof) at a frequency selected based on a relatively low impedance harmonic frequency, minimal plating, combination thereof, and/or otherwise. The shaped leading edge may correspond to the frequency (f) (or frequencies) or based at least in part on F(opt), by the signal constructor. The shaped (e.g., sinusoidal) leading edge is followed by a relatively steady charge current (e.g., the body portion 1020) terminating at a falling edge 1040. The falling edge may be followed by a sinusoidal heating portion. However, in the example of a FIG. 2, the body portion is followed by a rest period 1030. The rest period may be zero current or may be some non-zero DC current less than the substantially DC current of the body portion. The peak current of the body portion may be in the range of 10 A to 60 A depending on the type of cell with the rest current in the range of 0 A to 10 A. Discussed below, the shaped leading edge, body portion, and/or overall width may be a function of the mean current. Values for peak current, rest current, and other values may vary, as noted elsewhere herein, depending on temperature, the type of cell, circuit capabilities, state of charge, and other factors. In this example, if non-zero, the rest current may be less than a specified charge current if referencing conventional CCCV charging parameters. If, for example, the charge current using CCCV charging is around 4 A and 4.2 V, the rest current may be 2 A or less. A charge waveform may involve repeating charge signals, which charge signals may change over time (e.g., any one or a combination of edge time, body time, rest time, duty cycle may change.

To obtain impedance, in one possible example, the impedance analyzer 112 employs a method of determining impedance based on the voltage and current signals I(k), I(k−1), I(k−n) and V(k), V(k−1), V(k−n). The voltage and current signals may each include one or more harmonics. For example, the leading edge of a charge signal may have the shape of a portion of sinusoid at a particular frequency. In another example, a body portion of a charge signal may be composed of one or more harmonics. In the example discussed, the impedance analyzer determines the impedance of the battery to an applied charge signal (current and voltage components thereof). However, it is also possible, particularly at the beginning of charge cycle, to employ a probe signal that may include a spectrum of harmonics, which may be used by the system to assess the impedance of the battery to the various harmonics and in general initiate the MPC and the initial charge waveform to be applied to the battery. The probe signal may also be interleaved during charging or run discretely at the start of charge during charge, and/or otherwise. In one example, the probe signal may be square wave or square pulse. In one specific example, the probe signal is a square wave centered at zero amps. In one possible example, the probe signal is a square wave centered at zero amps, with a +4 V (positive) portion and a −4 V (negative) portion. Here, the mean current is 0 A. The duty cycle is 50%. The frequency, duty cycle, current or voltage magnitude or other attributes of a probe signal may vary depending on cell type, device type, temperature, state of charge and other possible parameters. These parameters may be determined based on characterization of any given cell type. In one specific example, the square wave probe is applied to the battery for a single period of about 30 msec. Stated differently, the probing signal may comprise a positive square pulse of some current and a negative square pulse of some current. The pulses may have the same duration, e.g., 15 msec each, or may have different durations. A probe signal may be only a positive pulse (current to the battery) or only a negative pulse (discharge current from the battery). Each pulse may include the same magnitude current or the pulses may be asymmetric. While other probing signals are possible, a square pulse or wave has harmonic content at a wide range of frequencies and is efficiently generated by a range of conventional charging hardware topologies. In general, the purpose of the probe signal is to very briefly and discretely introduce a wide spectrum of harmonic content into the battery in order to assess the impedance of the battery to various harmonics. Thus, whether a square wave or square pulses or other signals, the probe signal is intended to introduce, momentarily, a spectrum of harmonics to the battery it is possible to also introduce a sequence of probe signals to assess the impedance response to a harmonic over time. In the case of a square wave centered at zero amps, there may also be an equal magnitude current to and from the battery with little or no net charge effect. In some arrangements, it is possible to inject a range of different probes, containing different harmonic content. Even though uncontrolled and/or high frequency harmonics may have deleterious effects on the battery, the system is only applying the square pulses in a very short duration for the purpose of obtaining the impedance spectrum thereby substantially avoiding such effects.

In the presence of the charge signal waveform or a probe signal, the system measures the current and the voltage at the battery. The current and voltage portions of the charge or probe signals are captured in the time domain. For each of the current and voltage signals, the system obtains a frequency spectrum from which the system may further generate an impedance spectrum. In one example, the impedance analyzer may generate domain transforms of the current and voltages signals to produce a voltage frequency spectrum and a current frequency spectrum. The domain transform may be a discrete Wavelet transform using a Morlet wavelet. In some instances, the wavelet may also be considered a Gabor wavelet or complex Morlet wavelet. In one possible implementation, the system may use fixed point arithmetic to generate the impedance spectrum, which may allow for use of relatively lower cost and simpler microcontrollers or other computing platforms more typical of some charging environments where significant computational power is not otherwise necessary.

From the frequency spectrums of the current and voltage signals, the system generates the impedance spectrum. In one example, the impedance spectrum is generated from dividing the voltage spectrum by the current spectrum. More particularly, complex voltage values at various frequencies are divided by complex current values at the same frequencies to generate impedance, which may be a complex component of impedance, at the various frequencies. This may generate a complex valued impedance spectrum. In some examples, it is sufficient to limit the generation of an impedance spectrum to a discrete range of frequencies, e.g., 200 Hz to 3 KHz.

Regardless of the technique, the impedance analyzer 112 generates at least one impedance value. In a particular example, the impedance analyzer generates an impedance spectrum that associates the impedances of the battery to a particular frequency of a harmonic of a signal applied to the battery. So, in a simplified example, in a square pulse probing signal applied to the battery or a shaped charge waveform, there will be a number of harmonics. Through the technique discussed here, the system generates discrete impedances of the battery to some or all of the discrete harmonics in the charge or probe signal. The spectrum, at a generalized level, shows the resistance of the battery to a particular frequency of charge signal. The battery may have more or less impedance (more generally resistance) to different frequency harmonics of the probe signal.

The impedance analyzer may thus generate one or more impedance values associated with a respective one or more frequencies, which may be of harmonics, when a signal having those frequencies is applied to the battery. As part of generating the frequency output, the impedance analyzer generates an impedance spectrum (Z). The impedance may be characterized by the imaginary, real or both imaginary and real components of impedance. Similarly, other frequency-based responses or impedance derived terms such as susceptance, admittance and capacitance may be used. In general, in various embodiments where impedance values are being considered, the technique assesses harmonic values where the values, alone or in combination, are associated with some impedance. Given the generally inverse relationship, the term impedance as used herein may include its inverse admittance, including its constituents of conductance and susceptance alone or in combination. In one specific example, the impedance analyzer generates a frequency or frequency spectrum associated with the lowest impedance. So, for example, the system may generate a discrete frequency of the lowest impedance at the battery. In another example, the system may generate some spectrum of frequency values above, below or surrounding the frequency of the lowest impedance. The frequency value or spectrum is an output and is fed to the signal constructor. In one specific example, the selected frequency or frequency spectrum is aligned with the imaginary component of impedance.

The impedance analyzer, the optimizer, or some other component of the controls 100, using the impedance spectrum and/or discrete components thereof may also generate a state of health (SOH) output. The SOH is a measure of the current SOH(k) and may be based on modeling battery impedance. In one example, the SOH is output as a value between 0 and 1, with 1 representing a new battery with no degradation, and 0 representing a battery at a specified end of life. SOH may account for plating within the battery.

Figure 3A:
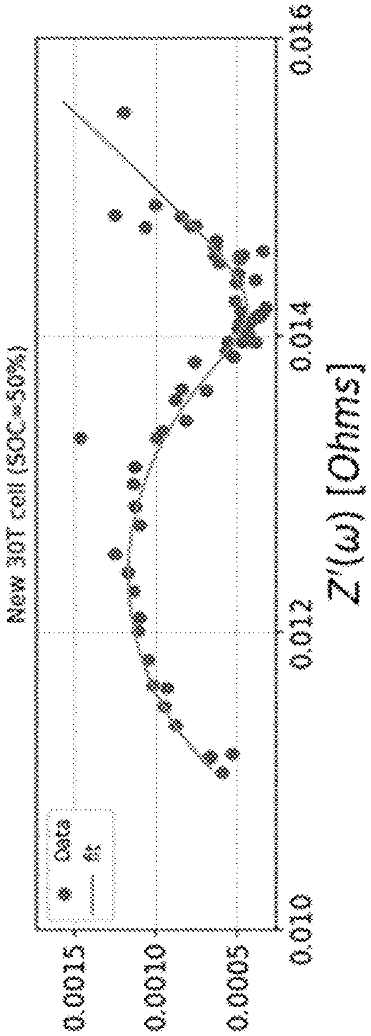
FIG. 3A is a Nyquist impedance spectrum for a new lithium-ion rechargeable battery cell at 50% state of charge.
Figure 3B:
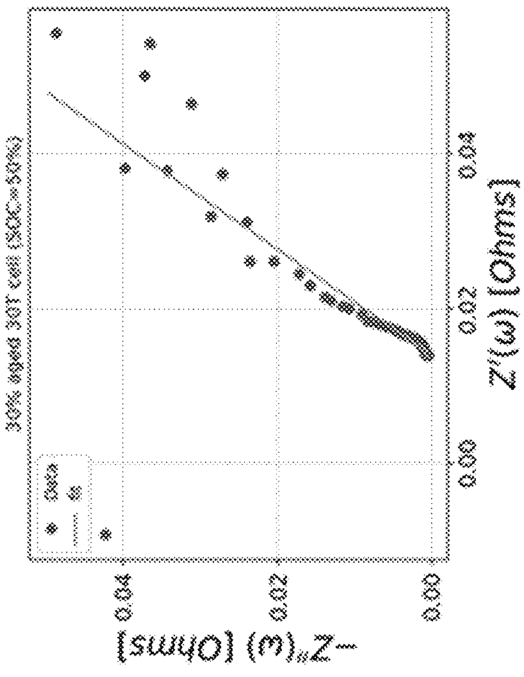
FIG. 3B is a Nyquist impedance spectrum for a 30% aged lithium-ion rechargeable battery cell at 50% state of charge.
Figure 3C:
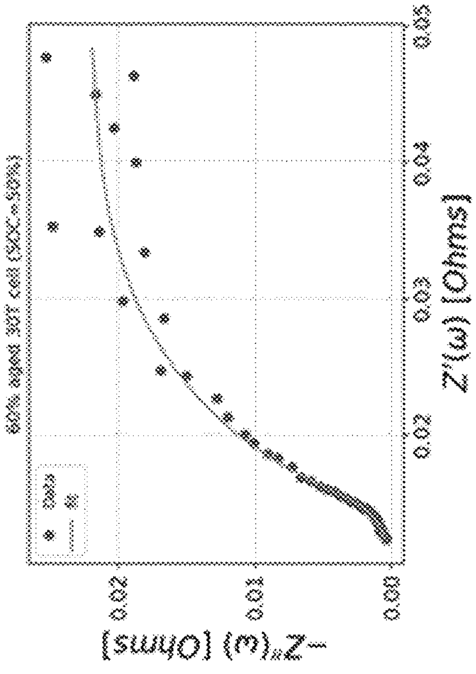
FIG. 3C is a Nyquist impedance spectrum for a 60% aged lithium-ion rechargeable battery cell at 50% state of charge.
Figure 4A:
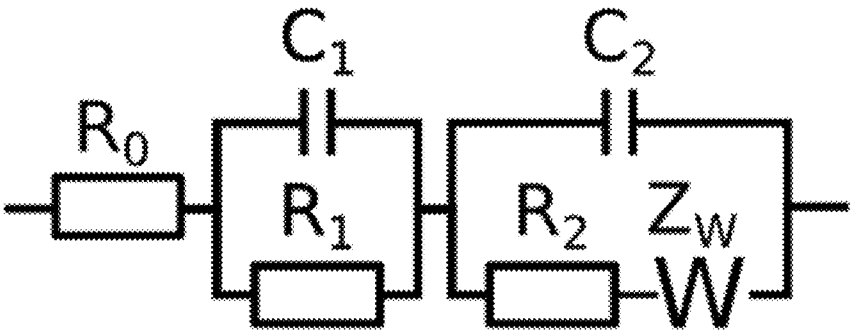
FIG. 4A is an equivalent circuit model of a battery in accordance with one embodiment.
Figure 4B:
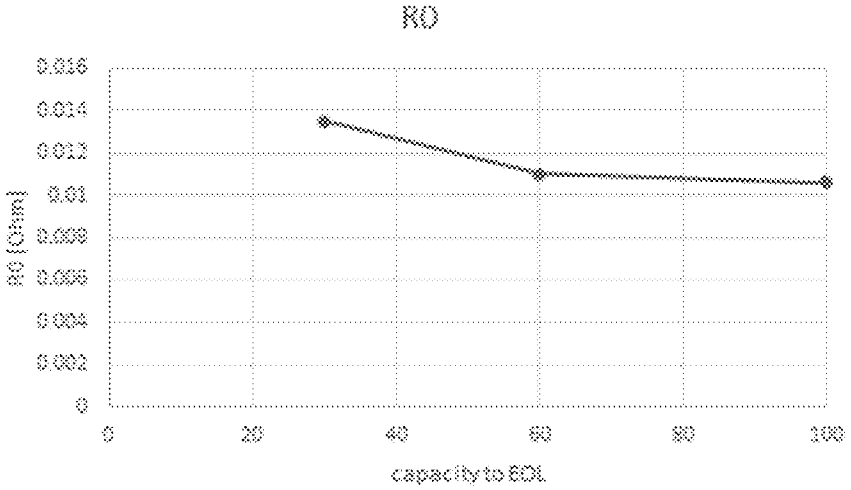
FIG. 4B is a graph illustrating a relationship between R0 of the equivalent circuit and state of health.

In one example, the system applies a probing waveform, which may be a square pulse to generate including various harmonics as introduced above, to generate impedance Nyquist plots as shown in FIG. 3A (New 21700 Lithium-Ion rechargeable cell at a 50% SOC), FIG. 3B (30% Aged 21700 Lithium-Ion rechargeable cell at 50% SOC) and FIG. 3C (60% Aged 21700 Lithium-Ion rechargeable cell at 50% SOC). By fitting the Nyquist plots, the system can obtain estimates of the component values in the equivalent circuit model of a battery cell illustrated in FIG. 4A. In the equivalent circuit model, R0 represents cell bulk resistance, C1 and R1 represent charge transfer impedance, C2 and R2 represent diffusion impedance, and Zw represents the Warburg element. C1, C2 are constant phase elements. In one example, the system represents SOH by referencing the value of R0. As illustrated in FIG. 4B, when the cell is aged, the SEI layer thickness increases through plating, and the bulk resistance of the battery cell therefore increases.

For example, the impedance analyzer may include a model that generates the SOH metric based on the impedance spectrum, voltage and current values, and/or other information.

Figure 5:
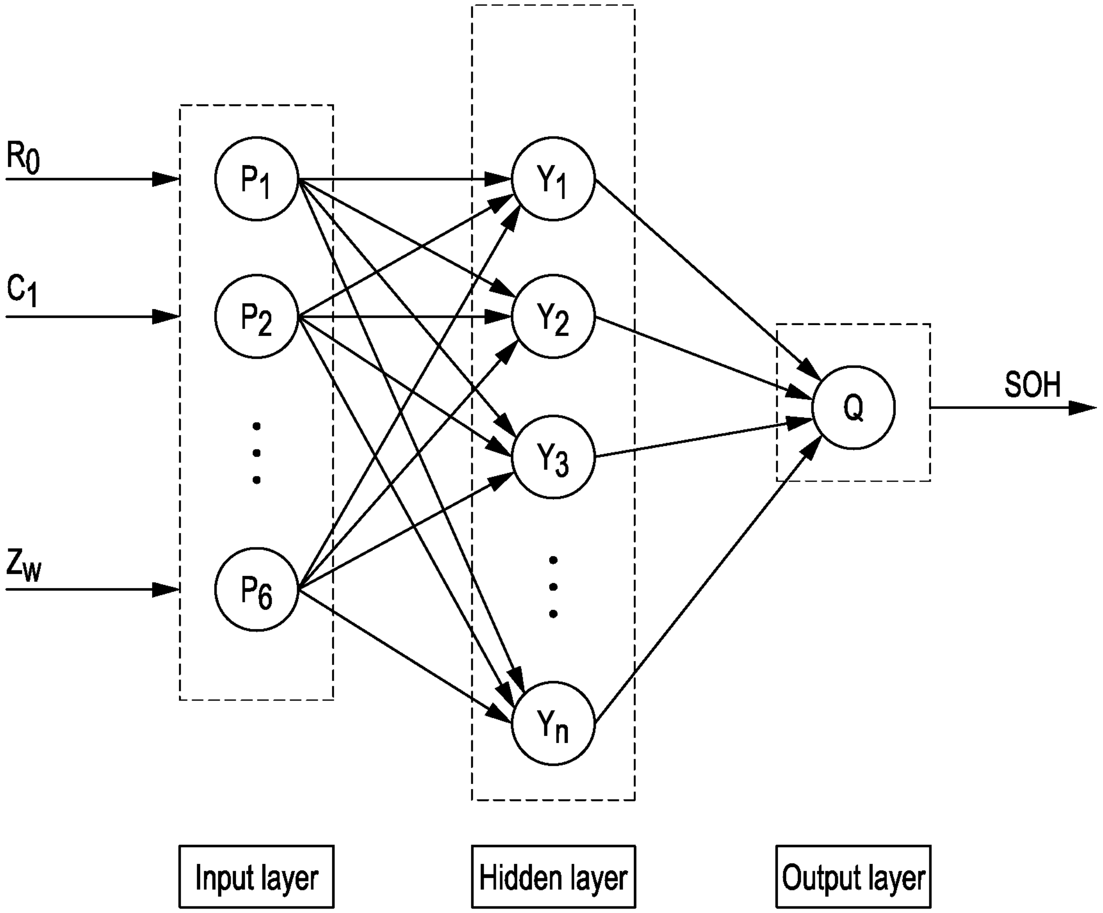
FIG. 5 is a diagram of a neural network model used to generate state of health in accordance in one embodiment.

In one specific implementation, the model may be a neural network, illustrated in FIG. 5, in which all values of the components in the equivalent circuit are inputs, with the SOH being the output after a hidden layer of the neural network. The neural network is pre-trained based on experiment data or simulations results before being accessed or otherwise deployed in the system.

From the impedance spectrum or otherwise, more specific example, the system may identify a particular harmonic as F(opt) that is used to define the leading edge of the charge portion of the charge waveform from the signal constructor. As discussed herein, the system may shape the leading edge and/or define harmonic components of the charge waveform and particularly the body portion of the charge portion. In one possible arrangement, to determine the shape of the leading edge of the charge signal, the system determines the optimal frequency from the impedance spectrum generated from the impedance analyzer. In one particular example, the optimal frequency is the frequency associated with the lowest impedance (specifically, reactance in some embodiments) in the impedance spectrum. Thus, the system choses the frequency associated with the lowest impedance. It should be appreciated that there may be instances where the system can instead assess admittance, e.g., the highest admittance or the imaginary part of admittance-susceptance. In general, a charge signal applied to the battery with a shape of a frequency associated with a lower impedance will more efficiently transfer energy for charge as compared to frequencies associated with a higher impedance. In some instances, the charge signal is also associated with relatively less plating and hence slower degradation of SOH. The optimal frequency is set as the leading edge of the charge signal generated by the signal constructor. So, the leading edge defines a portion of a sinusoid at the identified frequency as shown in the example of FIG. 2.

Besides the shape of the leading edge of the charge portion, the optimizer 110 and signal constructor 114, and/or other components described herein, may also determine the overall attributes of the signals including the length of time of the rest period relative to the charge time (including the shaped portion and the body portion), the overall signal period and other attributes. In one possible example, the period of the charge signal and the rest period are preset and based on battery characterization. The period of the charge signal includes the shaped leading edge and the body portion following the shaped leading edge. In various possible examples, the charging portion may fall in the range of 100s of microseconds to 10s of milliseconds. The overall period, also referenced as the duty cycle, includes the charging portion and the rest period (or heating portion). The rest period (or heating portion) may fall in the range of 100s of microseconds to 10s of microseconds. In other possible examples, the period may fall in the range of 100s of microseconds to 10s of milliseconds. A peak current at the peak of the shaped leading edge and the body portion of the charge portion of the cell may be around 20 A but the peak current value depends on the cell type, temperature, characterization and other factors and thus may differ significantly from the example peak current. One example of determining charge current, including the peak current is discussed below as is based on a mean current generated from the optimizer.

The predictive controller architecture further includes an evaluator 116 that receives as its inputs, the predicted state of charge (SOC(k+1)), the predicted temperature T(K+1), and an output or outputs of the impedance analyzer such as the SOH and/or impedance spectrum and/or F(opt). The evaluator is also aware of the type of battery being charged, including any possible specifications of charge current and voltage, and system current limits, among other values.

The evaluator may further receive or more generally include various performance targets or profiles and other information to define a charge waveform. In one example, one or more such parameters may be defined by way of the user interface 104. Performance targets may include charge rate, which may be provided as a charge profile reflecting a change in SOC over a period of time (SOC trajectory), temperature parameters including temperature information associated with low temperatures at which charging may damage the battery and high temperatures at which charging may damage the battery (e.g., a minimum and maximum temperature value below which or above which charging should not occur). Charge rate may alone or as a separate value define or reference a maximum available charge current for the system—a physical limit of the charge current that may be provided by the system, a limit imposed by a manufacturer, or other possible limits. In terms of a charge profile, the profile may reflect the time to charge a battery some percentage. The percentage may be simply a range such as 80%, regardless of starting state of charge, the percentage may be to an end state such as achieving an 80% charge from whatever the starting charge, and other values. The end-of-life capacity is a value indicative of when the system will recognize that the battery life has expired. For example, the end-of-life capacity may be 80% such that when the battery capacity declines 20% from when it is new and has a capacity of 100%, the battery will be considered at its end of life. Similarly, a SOH of 1 may be reflective of a 100% capacity and a SOH of 0 may be reflective of a capacity of 80%, recognizing that other information besides capacity may be reflective of SOH. In terms of SOH, as discussed relative to some embodiments, SOH is based on anode overpotential. In such cases, parameters related to anode overpotential may be used to generate an SOH value or scale. In general, it is considered that relatively faster charging degrades a battery more quickly than relatively slower charging. Charging at too low or too high temperatures may also degrade battery life more quickly. Thus, these parameters are intertwined and may be taken into account when the system determines a charge signal.

The charge parameters may be entered by way of a user interface. In other examples, the system may reference predefined profiles stored in memory. In another example, the system may use such values in a battery characterization system where a baseline charge signal is defined by the MPC, which baseline charge signal may be used in an MPC system or as a preset charge waveform, which may or may not then be modified. In another example, the baseline charge signal may be used in a charge system of FIG. 1 where there is not a user interface and as such some or all charge parameters are preset. In yet another example, the charge parameters are used to generate the baseline charge signal but a system used to charge a battery includes an evaluator that receives T(k), SOC(k) and output from the impedance analyzer but does not receive other charge parameters. In yet another example, a system deployed to charge a device may allow a user to customize settings such as charge rate and end of life such that the system will optimize a charge signal to account for user defined settings.

It should be recognized that a system may prioritize some charge parameters over others. For example, the system may not allow any charging to occur above a specified temperature or below a specified temperature, and hence it may not be possible to charge according to an SOC trajectory (e.g., at a specified rate) without exceeding a max temperature or may not begin charge until battery temp reaches the minimum temperature. In such examples, the system may be defined to prioritize temperature over charge rate to not damage the battery. In another example, a charge time may be inconsistent with the maximum charge rate, and hence the system will not generate a charge signal that exceeds the capability of the system.

Charge parameters may further include a temperature value including a minimum temperature, a maximum temperature, a temperature range, or other definitions of temperature constraints on the battery under charge, at the beginning of charge, at the end of charge, or combinations of the same. In some instances, the minimum temperature may be a temperature at or below which the battery should not be charged. The temperature range may define a range of temperature where safe charging may occur. The maximum temperature may define an temperature above which charging should not occur. In some examples, the system may adjust the charge waveform over time to maintain the temperature within the safe operating range and/or to not exceed the upper limit understanding that charging warms the battery. In some examples, the system may define a charge waveform primarily intended to warm the battery when not at a sufficient temperature to otherwise charge.

Charge parameters may further include a definition of a target lifetime reflective of a number of cycles defining how many charge and discharge cycles the battery may complete before its capacity is reduced to some set level. The SOH value may be used, alone or in conjunction with outer information such as the present number of charge cycles, the degree of each cycle (e.g., starting SOC to ending SOC of any cycle, recognizing that ending to starting SOC, on or off charge may also be considered when assessing a cycle).

The evaluator 116 may include/execute one or more cost functions (also referred to as loss functions) to produce one or more performance indexes. A performance index provides a difference between predicted performance and any predefined performance profiles or values of the evaluator. For example, the evaluator may assess the predicted SOC against a charge rate profile to determine how the SOC is tracking against the charge rate profile. Similarly, the evaluator may assess the predicted temperature against a temperature profile.

In one specific arrangement, the evaluator runs a cost function to minimize two performance index values J1 and J2, where:

$$J1 = SOC \text{ expected} - SOC\ (K+1)$$

$$J2 = T \text{ expected} - T\ (k+1)$$

Here the SOC expected is from charge profile defining a SOC progression over time and T expected is from a temperature profile over time.

The output of the evaluator is fed into the optimizer 110, which produces a mean current value for the charge current waveform. The charge current waveform, as depicted in one example in FIG. 2, is a shaped waveform and the mean current value may relate to the overall charge current energy from the shaped waveform.

SOC and Temperature are functions of mean current; therefore, the two performance index values J1 and J2 are also mean current dependent. In one example, the system uses a cost function that is the sum of all weighted performance index values:

$$\text{cost function } J = w_{SOC} * J_1(I)^2 + w_T * J_2(I)^2$$

The optimizer will seek the mean current to minimize the cost function.

The mean current value (I) is fed into a signal constructor that generates the control signals to produce a shaped charge waveform I(k) using the mean current and the frequency or frequency spectrum from the impedance analyzer.

As noted above, the system may apply a complex shaped charging signal with a charging portion including a shaped leading edge and body portion and a heating portion or a rest portion, either or both of which may include a positive offset such that some charge current is transferred during either the heating portion or the charging portion. The mean charge current value may translate to various parts of the complex charging signal.

In one particular example, the system sets a peak current of the charge portion of the signal based on the mean value as well as other parameters of the charge signal such as overall period and rest period, which may be understood as the time of the charge portion of the signal and the time of the rest portion of the signal, duty cycle, or some combination thereof. As noted above, in determining the shape of the charge portion, the system may access time parameters of the overall signal such as an overall period of the signal and a rest period. With this information, the system can determine the time of the charge portion of the signal (shaped and body).

In one possible example, the system uses the current limit (mean current) to set the peak current of the body portion of the signal while also accounting for the charge transfer that occurs during the shaped leading edge. Generally speaking, the charge waveform may have a shaped leading edge. In one example discussed above, the shape is set at the frequency F(opt) of the frequency associated with the lowest impedance. If a spectrum is provided, the shaped leading edge may be set at the frequency associated with the lowest impedance in the spectrum. For comparison purposes, if the system were to select an extremely high frequency harmonic for the shaped leading edge, which would appear nearly as a conventional square wave, and the system determined a duty cycle of 50% (charge portion plus body portion is 50% and rest portion is 50%), with a current limit set at 5 A, the peak current of the charge portion would be 10 A. The system, however, for a charging signal, will generate relatively lower frequency harmonics as the shaped leading edge (not a high frequency sharp leading edge of a square wave) as such charge energy is transferred during the shaped leading edge as well as during the body portion of the charge. In the same example of a 50% duty cycle, a peak current at the upper portion of the shaped leading edge and the body portion, will be greater than 10 A if the mean current is set at 5 A as some charge is transferred during the shaped leading edge of the charge portion with the remainder transferred during the body portion of the charge. In such an example, the system considers both of the shaped leading edge and body within the 50%, and hence the peak current of the body is higher than 10 A as less energy is transferred during the shaped leading-edge portion as compared to a conventional square pulse. As such, the system, in determining the peak current, accounts for the charge transferred during the shaped portion and the body portion of the charge portion of the signal.

In many instances, the peak current may be greater than a set maximum current for the battery. In some instances, the system may determine a peak current that is greater than possibly sourced by the hardware of the system. In such instances, the system may generate a positive charge current offset of the rest period such that the mean current may be reached over the entire period of the signal (charge portion and rest portion). In other instances, the system may adjust the overall period such that the rest period remains the same, but the charge portion increases such that the mean current may be reached over the period of one signal by lengthening the time in which the charge signal portion is delivering a charge current. In another example, the system may maintain the same overall period while shortening the rest period.

In some instances, besides defining the leading edge based on the frequency provided by the impedance analyzer, the signal constructor 114 may also construct the body portion of the charge signal based on the frequencies of the impedance spectrum from the impedance analyzer. To construct a charge signal composed of harmonics at the frequency or frequencies identified form the impedance analyzer 112, the signal constructor may execute an inverse transform of the frequency domain spectrum from the impedance analyzer. Stated differently, the frequency domain representation (or representations) of the optimal frequencies from the impedance spectrum may be inversely transformed to define a charge signal, in combination with the mean current value from the optimizer, which may be a charge current waveform with the respective harmonic frequencies from the impedance analyzer forming at least the body portion of the charge signal. The signal constructor generates the signal or generates pulse control, which may be provided to charger 118, to form the charge signal.

Figure 6:
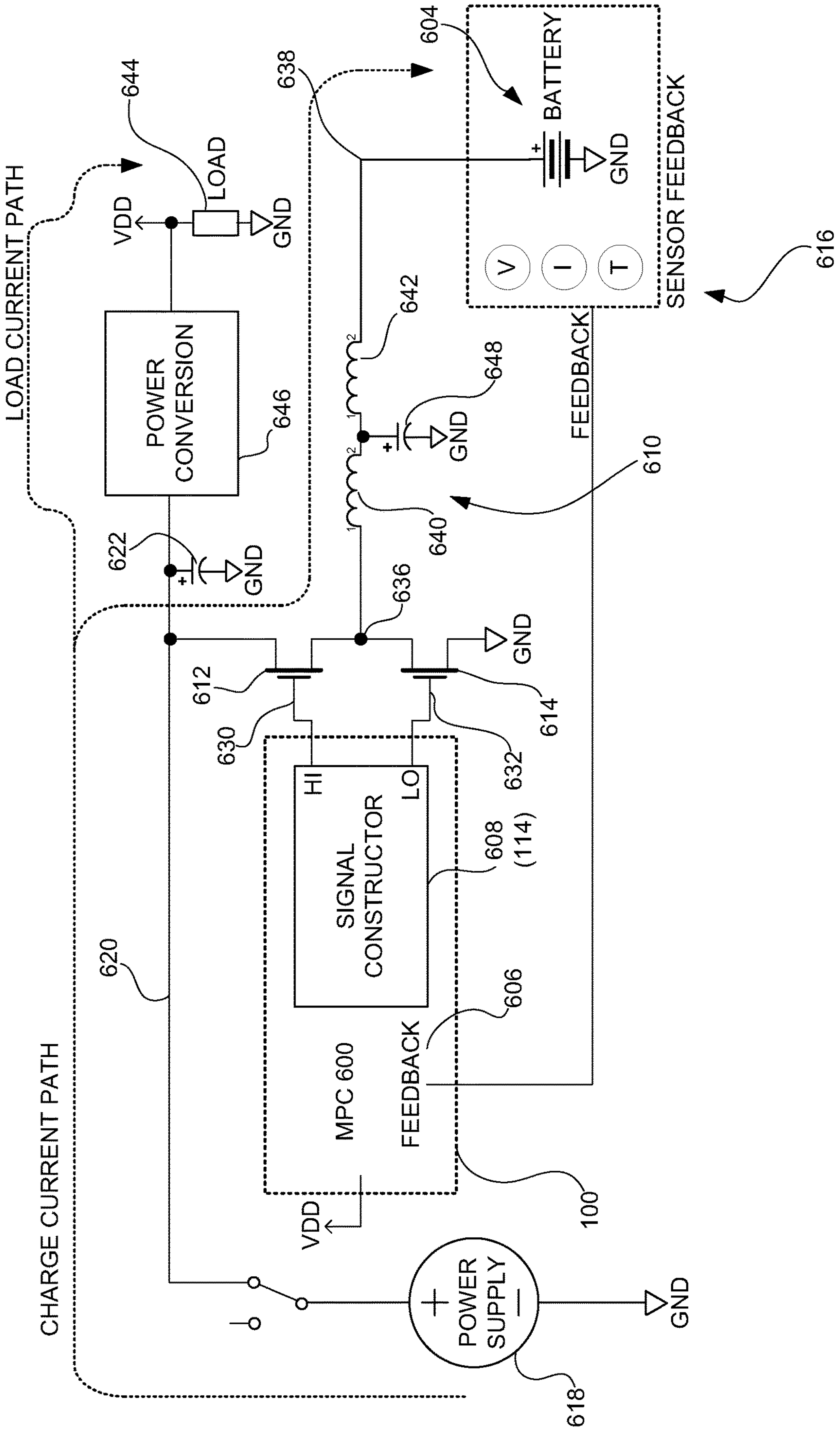
FIG. 6 is a circuit diagram of a charger to estimate and/or generate a charge signal based on operations of the model predictive controller in accordance with one embodiment.

FIG. 6 illustrates a battery charging circuit topology in accordance with one example of a charger 118. Arrows illustrated in the figures define current flow paths during different operational states of the system. In this example, the system is also configured to drive a load, which is intended for an embodiment where the MPC is integrated into a charging environment as opposed to a characterization environment. In FIG. 6, the system is shown in a configuration sourcing current (charging) to the battery and powering a load. It should be recognized that the system may also be operated to draw current from the battery (discharging or sinking), a discharge path to a capacitor on the rail and powering a load with the power supply on (connected to the rail). Further, the system may be operated in a configuration drawing current from the battery to a capacitor on the rail along with powering a load with the power supply off (not connected to the rail). In some versions, a discharge path may be initiated by quickly turning on or "blipping" a lower, second transistor.

FIG. 6 is a schematic diagram illustrating an example charge signal generator arrangement for charging a battery 604. The charge signal generator is connected to the signal constructor of the MPC 100. The MPC may be implemented in a processing unit or units, which may include a controller, such as a microcontroller, FPGA (field-programmable gate array), ASIC (application-specific integrated circuit), microprocessor, combinations thereof, or other processing arrangement, which through the arrangement discussed above produces controls for generating a charge signal from the charger. As noted above, the system may receive feedback including battery measurements from a battery measurement unit 616, such as current and/or voltage measurements at battery terminals of the battery 604 in the presence of a signal. In general, the charger may also include or be operably coupled with a power source 618, which may be a voltage source or a current source. In one embodiment, the power source 618 is a direct current (DC) current or voltage source, although alternating current (AC) sources are also contemplated. In various alternatives, the power source 618 may include a DC source providing a unidirectional current, an AC source providing a bidirectional current, or a power source providing a ripple current (such as an AC signal with a DC bias to cause the current to be unidirectional. In general, the power source 618 supplies the charge energy, e.g., current, that may be shaped or otherwise defined by the MPC and charger to produce a controllably shaped charge signal, which may also be controlled to heat or perform other operations. In one example, the signal constructor may provide one or more inputs to the charger, which inputs control switches to generate pulses to the circuit 610, which may also be referred to as a filter, which produces the shaped signal at the battery.

In some instances, the signal shaping circuit 610 may alter energy from the power source 618 to generate a signal that is shaped based on conditions at the battery 604 and based on operation of the MPC discussed herein. As noted, the battery measurement unit may also obtain other, besides voltage and current, battery attributes like temperature and provide information for the MPC to determine impedance at the battery 604.

Generally speaking, the signal constructor controls the switches 612 and 614 to generate a sequence of pulses at node 636, which are converted by circuit 610 to the charge signal shape. Similarly, during a heating function, the battery may be characterized, based on temperature, to understand impedance effects of a charge or discharge signal on the battery and a signal controlled based on the same. Here, the node 636 may similarly be controlled but such that current with defined impedance attributes is both sourced to and sunk from the battery by way of the circuit 610. It should be recognized that heating may also involve transitioning from current into and out of the battery, characterized in a way, that optimizes heating, minimizes or eliminates plating, and minimizes any energy storage in the battery during the heating sequence. Returning to the operation of charging, the signal generator 608 may generate one or more control signals based on the operations of the MPC and provide those control signals to the signal shaping unit 610. The control signals may, among other functions, shape or otherwise define the signal to the battery to approximate the shaped charge signal determined, selected or otherwise obtained by the MPC. The charge signal shaping circuit 610 may further filter any unwanted frequency attributes from the signal. In some instances, the shaped charge signal may be any arbitrarily shaped signal, such that the signal whether heating, charging or discharging, is not a constant DC signal and does not conform to a conventional repeating charge signal, such as a repeating square wave or triangle wave charge signal.

The circuit of FIG. 6 includes switching elements 612, 614, which may be considered part of circuit 610, to generate an initial sequence of controlled pulses at node 636, which are then converted into a shaped signal by filter 610, to produce a signal that is applied to or from the battery, in accordance with one embodiment. The switching elements may also be used to generate a discharge signal from the battery by similarly generated pulses at node 636, without the presence of charge current on the rail 620.

The circuit 600 includes the first switching element, e.g., transistor 612, and the second switching element, e.g., transistor 614, with the first switching element connected to the power rail and thereby connected to the power supply 618 during charge and coupled to a capacitor 622 on the rail during discharge, if part of an implementation. The capacitor may have various functions including discharge signal conditioning. The first transistor 612 may receive an input signal, such as pulse-width modulation (PWM) control signal 630, to operate the first transistor 612 as a switching device or component. In general, the first transistor 612 may be any type of transistor, e.g., a FET or more particularly a MOSFET, a GaN FET, Silicon Carbide based FETs, or any type of controllable switching element. For example, the first transistor 612 may be a FET with a drain node connected to a first inductor 640, a source connected to the rail and a gate receiving the control signal 630 from the signal generator 610. In various embodiments, the circuit 610 also includes the inductor 640 but may also have various other possible inductive elements. The circuit 610, and particularly the combination of inductors 642, 640 and capacitor 648, when operating in a bi-directional fashion for both charge and discharge and as described in more detail below, may be considered a boost topology when controlling current from the battery during a discharge portion of heating or more generally during sinking current to a load during normal operation.

Figure 7:
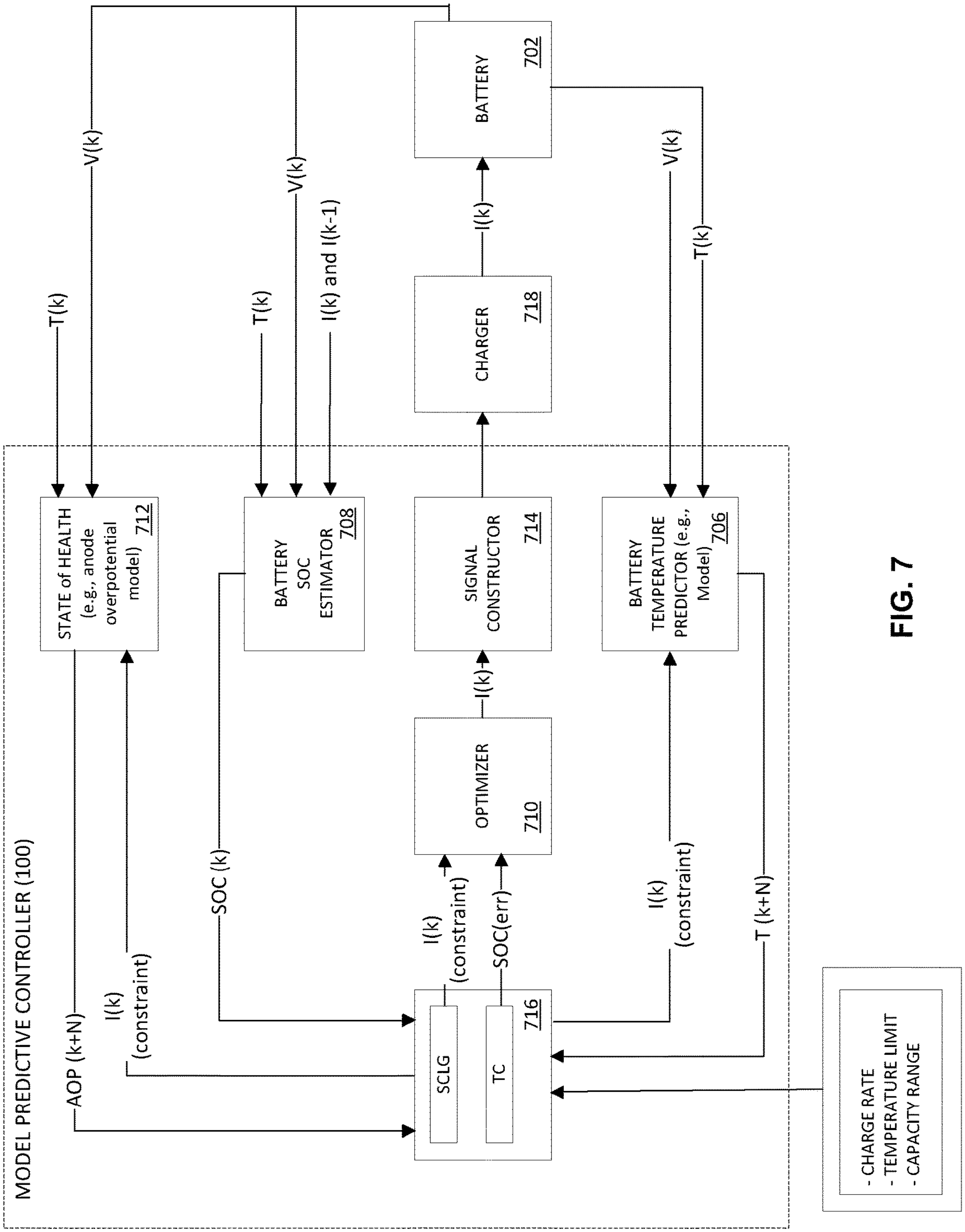
FIG. 7 is a system diagram of a model predictive controller and an associated battery system in accordance with one embodiment.

FIG. 7 illustrates an alternative model predictive controller architecture, which may be considered a model predictive control (MPC) system. The example MPC of FIG. 7 is similar to the example of FIG. 1 discussed above, with many blocks having the same functionality discussed above taking into account the difference in the architecture shown in FIG. 7, which includes the substitution of a state of health model 712 in place of the impedance analyzer discussed above with reference to FIG. 1. Here, the evaluator 716 and the optimizer 710 will also receive as inputs a predicted anode overpotential (AOP(k+1)) (discussed more extensively below) in place of the output of the impedance predictor, and will produce a charge current I(k) at which to charge the battery.

The control and signal flow in in the system of FIG. 7 at a current time step k can be described as a loop: from the battery 702, the system receives a measured temperature T(k), a measured terminal voltage V(k) and the current control input of the previous time step I(k−1); the controller 100 processes the received signals and generates the control input command I(k), which is the current at the current time step k; the charger 718 takes the command I(k), generates the actual current control signal I(k) and sends it to the battery 702 as a charge current. The current control signal is also based on a predicted anode overpotential, a predicted temperature and an estimate of state of charge.

The MPC system involves an evaluator 716 that processes a predicted anode overpotential AOP(k+N), a predicted temperature T(k+N), and an estimated state of charge SOC (k). In one possible implementation, the evaluator may also receive or otherwise use a charge rate command or setting, a temperature limit (or temperature range), a reference SOC, which may be set or derived from the charge rate or other values, and/or a capacity range, which information may be preset, received from a user interface, or received or accessed from some other component (e.g., the system or environment in which the MPC is operating). AOP(k+N) and T(k+N) represent the predicted anode overpotential and the predicted temperature over a prediction horizon N, and SOC(k) indicates the estimated SOC at the current time step k. The evaluator may include two functions: (1) determine or evaluate an SOC tracking error; and (2) update the current control input constraints in real time. For (1), a comparison may be made between the estimated SOC, SOC(k) and the reference SOC, and the difference is calculated (SOC(err)); for (2), a signal constraint law generator (SCLG), which may be a distinct functional block of evaluator, produces a current constraint based on the predicted anode overpotential and the predicted temperature, which may also consider a predicted battery voltage.

The MPC system also includes an optimizer 710, which may be an MPC core that realizes the SOC tracking in an optimal way while considering the current and/or SOC constraints from the evaluator. In one particular example, the optimizer 710 generates the real-time current input constraint, $\bar{I}(k)$, and the SOC tracking error $e_{SOC}(k)$ (also labeled SOC(err)). The optimizer focuses on looking for a future control series, $\{I(k), I(k+1), \ldots, I(k+N_c-1)\}$ that is able to optimally minimize a cost function while ensuring the future control series respects the current constraint $\bar{I}(k)$. In one example, the cost function is:

$$J(k) = \sum_{i=1}^{N_p} w_{p_i} e_{SOC}^2(k+i) + \sum_{i=1}^{N_c} w_{c_i}(I(k+i-1) - I_{ref}(k))^2,$$

where:

$N_p$ is the MPC prediction horizon on the SOC tracking error, $N_c$ is the MPC prediction horizon on the control input, $w_{p_i}$ and $w_{c_i}$ are the weights for the SOC tracking error and the control input, respectively, and $I_{ref}(k)$ is the desired or reference current charge rate.

The optimizer eventually only implements the first value of the future control series, i.e., I(k) as the control input command for the current time step k and sends it to the signal constructor 714, which produces the charge current alone or in combination with the charger 718.

The SOH predictor 712 takes as its inputs T(k), V(k) from the battery 702 and the adjusted future current constraint series {$\bar{I}$(k), $\bar{I}$(k+1), . . . , $\bar{I}$(k+N−1)} from the SCLG or more generally the evaluator, and calculates the future AOP(k+N) on some prediction horizon N. The prediction may happen multiple times in a single time step. To initialize this process, the SOH predictor 712 takes the previous control input I(k−1) and expands it to a current series {I(k−1), I(k−1), . . . , I(k−1)} with the length of N, based on which, SCLG then generates and adjusts the future current constraint series.

The battery temperature predictor 706 takes as its inputs T(k), V(k) from the battery 702 and the adjusted future current constraint series {$\bar{I}$(k), $\bar{I}$(k+1), . . . , $\bar{I}$(k+N−1)} from SCLG, and calculates the future T(k+N) on some prediction horizon N. The prediction may happen multiple times in a single time step. To initialize this process, the SOH predictor 712 takes the previous control input I(k−1) and expands it to a current series {I(k−1), I(k−1), . . . , I(k−1)} with the length of N, based on which, SCLG then generates and adjusts the future current constraint series.

The battery SOC estimator 708 estimates the SOC for the current time step k by applying the measured T(k), V(k) from the battery 702 and the current control input I(k) and the previous control input I(k−1) from the charger 718. A simplified extended Kalman Filter (EKF) may be used for the battery SOC estimator 708.

In more detail, the state of health (SOH) predictor 712 may be a numerical model or other form of model of whatever battery type is to be charged, assessed or otherwise analyzed and/or managed using the MPC. In one example, the SOH model is a Python based numerical model. In a specific example, the SOH model uses a PyBaMM (Python Battery Mathematical Modeling) physics-based battery simulation model. The model receives as its inputs V(k) and T(k), which may be measured voltage and temperature while charging the battery, which voltage and temperature may be measured at the battery. In some implementations, the SOH model may receive additional information, such as I(k), I(k−1) and/or the charge current constraints or some other measure or information concerning the charge current. The model may also receive measurements or determinations of state of charge (SOC(k)) from the SOC predictor 708.

The battery temperature model 706 may also use a PyBaMM model, which may be the same or a different model from what is used to predict anode overpotential. In the case of battery temperature, the model may receive as its inputs V(k) and T(k), and may also receive I(k). T(k) may be a measurement of the battery temperature. The temperature measurement may be done by way of a sensor operably coupled with the battery terminals or some other part of the battery. In some cases, the battery may be a part of some system, e.g., a battery management system, and the temperature value received from such a system. While not shown, the model may also receive an environmental temperature value. Further, a predicted current value I(k+1), current constraint or some other information concerning charge current may be fed to and used by the SOH, SOC, and or Battery Temperature models. In some examples, the model may also receive as its inputs V(k) and I(k), and not a measurement of battery temperature T(k), and the model may predict the temperature T(k+1) without some form of measurement of battery temperature.

Nonetheless, the model 706 produces a predicted temperature T(k+N) at some time N in the future. Each N may represent a time of 0.32 seconds to 3.2 seconds, in some possible implementations. Once set or scheduled, N may be fixed as the control cycle parameter, noting that in some versions N is reduced in a voltage control portion of the system. The schedule of the prediction horizon N determines how far the system is configured to predict the model responses. A higher N means a further in the future prediction, and an earlier constraint update in the SCLG. As a result, different N values can give distinct control input strategies.

In one example, the SOH model 712 is optimized to predict an anode overpotential response. The output of the SOH model is thus an anode overpotential value (AOP(k+1)) or a value representative of anode overpotential and other factors. Anode overpotential is representative of lithium plating. Lithium plating is a term that references the build-up or plating of lithium on the anode. Lithium plated on the anode is no longer available for lithium-ion charge and discharge reactions and thus degrades battery capacity and the rate of capacity decline depending on the rate of lithium plating. The rate of capacity decline may be derived from anode overpotential predictions discussed below, such as relative predictions of anode overpotential between successive charge cycles. Lithium plating on the anode further interferes with lithium transport to and from the anode during charging and discharging reducing charge and discharge performance. In generally, lithium plating degrades a battery over time.

In battery charging environments, outside a sophisticated laboratory or similar setting, anode overpotential cannot be measured directly in real-time. As such and instead, the MPC uses the SOH model to predict the anode overpotential based on the inputs (e.g., T(k) and V(k), although other, fewer or additional inputs may be considered depending on the type of model, etc. The predicted anode overpotential (AOP(k+N)), along with the SOC (k), from the SOC model 708, and T(k+N) are fed into the evaluator 716.

In one example, the SCLG may be configured to maintain the anode overpotential at some value greater than a constraint of 0 volts and to similarly ensure that the battery does not exceed a temperature constraint. The evaluator 716, alone or in combination with the optimizer, may include computer executable instructions or otherwise be configured to execute and manage the method of FIG. 8 to address anode overpotential and any other constraints. The example of anode overpotential and temperature are described as two possible constraints that the SCLG manages (attempts to maintain above 0 volts and within or under some temperature range or value) by altering charge current; however, the SCLG, or more generally the MPC, may also consider additional constraints or different constraints, alone or in combination with anode overpotential and temperature such as charge rate, which additional constraints may be hard or soft constraints. In such possible alternative MPC's, a model or models are deployed, which predict how charging a battery, taking into account various charge related attributes, such as charge current (e.g., I(k)), charge voltage (e.g., V(k)), battery temperature during charge (e.g., T(k)), actual or predicted state of charge, impedance, and other possible charge related attributes, will affect whatever constraint is being predicted and then acted on by the evaluator to produce a charge current constraint that is processed by the optimizer to produce a command by which the charge signal is produced at the battery. The predicted value or other information for any given constraint is then addressed by the evaluator, along with other possible information, to affect a charge parameter that will maintain the predicted constraint relative to some value, range of values, or the like.

Returning to the example of an anode overpotential constraint, which is representative of state of health (SOH) of the battery cell, it has been determined that an anode overpotential of 0 or less than 0 volts may accelerate lithium plating, leading to a relatively faster capacity degradation. Conversely, to slow lithium plating, and slow capacity loss and fade, the MPC operates to adjust charge current to maintain the anode overpotential to a value greater than 0 volts. In some examples, the MPC is configured with an anode overpotential constraint of some value slightly greater than 0 volts, e.g., somewhere in a range of 0.005 and 0.05 volts, to provide for margins of error in various measurements, predictions, and the like. Other ranges are possible depending on the type of battery and other information.

In one possible arrangement, the MPC is producing a controlled direct current (DC) charge current to the battery for a period of time until the MPC transitions to a constant voltage form of charging toward the end of a charge cycle. During the controlled current phase, the battery is charged at a charge current I(k), which value of I(k) is controlled and determined by the MPC considering the constraints assessed at the evaluator, among other things, as discussed herein. During operation, the voltage at the battery may be monitored under the controlled current being applied. When that voltage begins to rise above some threshold, e.g., 4.2 volts for some Lithium-Ion battery types, charging may transition to a constant voltage regime. Here, voltage is monitored and charge current steadily reduced whenever the voltage rises above the threshold. The constant voltage portion of the charging routine may not take into account the anode overpotential and temperature predictions; as such, it may be a simple and separate routine run by the evaluator or it may be preformed by separate component such as proportional integral derivative controller (PID controller) or otherwise. In some arrangements, voltage is also monitored during the controlled current phase and/or in place of a constant voltage phase.

With reference to generating a current magnitude, the MPC system is optimized to generate the charging current magnitude; that is, various aspects of the MPC generate and take as the inputs the estimated SOC(k), battery temperature T(k), predicted battery temperature T(k+N), predicted anode overpotential AOP(k+N), terminal voltage V(k) and the previous control current I(k−1); and, the MPC calculates the current magnitude I(k) as the control signal for the current time step k. The current magnitude is then used, such as by the signal constructor and/or charger, to generate the charge current applied to the battery. In this example, the MPC relies on altering the charge current value to manage anode overpotential and battery temperature within their respective constraints.

The MPC may also receive other constraints or attempt to manage other constraints, which may be considered soft constraints. A hard constraint is one that the MPC does not violate or attempts to not violate, whereas a soft constraint is one that the MPC attempts to achieve but will violate in order to not violate a hard constraint. The MPC, in a system where both hard and soft constraints are employed, may be configured to not violate a hard constraint in favor of a soft constraint. For example, the system may have a soft constraint of charge rate, which may be set as a rate (e.g., 1 C, 1.5 C, 2 C, 3 C etc.). A higher charge rate, at a basic level, might allow a battery to charge more quickly and hence be returned to service relatively more quickly or more quickly increase in SOC. Higher charge rates, while desirable, may also be accompanied by higher rates of temperature increase and may also be related to anode overpotential. In such a system, the MPC will manage the hard constraints of anode overpotential and temperature, while attempting to also achieve the charge rate. So, in such a system, if the hard constraints cannot be met at a relatively high charge rate set as a soft constraint, then the MPC will violate the soft constraint, e.g., lower the charge rate below the soft constraint limit, to not violate a hard constraint of anode overpotential and/or temperature, in this example. The system also generates a charge constraint, such as a current constraint, as a function of other constraints, which is then optimized to produce the ultimate charge signal.

In the embodiment of FIG. 7, the SCLG analyzes battery temperature and anode overpotential to ensure optimal and safe charging operation. In the example illustrated, the system does not directly measure anode overpotential. The system also does not need to directly measure battery temperature, which may be similarly predicted with the battery temperature predictor based on measurements of voltage and current and in the absence of a direct temperature measurement. Whether either constraint is measurable, the system is able to still consider these attributes to generate an optimal charge signal managing either or both constraints within their respective constraint limits. Therefore, the MPC, as some constraint transfer mechanism, transfers the battery temperature and anode overpotential constraints into practical current signal constraints.

As introduced above and in one possible example implementation, the SCLG may use a PyBaMM cell model for SOH (e.g., to predict anode overpotential) and to predict battery temperature. The model may also predict battery voltage and manage it within a constraint, which may be employed, alone or in combination with other constraints, toward the end of charge in a form of constant voltage portion of charging. The MPC, such as through an SCLG employed at the evaluator, may also address battery voltage (V(k)) and manage it within a constraint. The PyBaMM model is a Python-based, numerical approximation of the physical battery dynamics, used to predict the battery cell responses (e.g., voltage, temperature, and the anode overpotential) on a desired prediction horizon N. Specifically, by applying the previous current input I(k−1) as the future current input for the next N time steps (I(k−1)=I(k)=I(k+1)= . . . =I(k+N−1)), as well as values discussed herein, the PyBaMM model calculates the corresponding voltage, temperature and the anode overpotential responses at time step k+N in the future. A numerical searching technique, an example of which is discussed below relative to FIG. 8, may be employed by the SCLG and is designed to efficiently search and find out a suitable future current input constraint where those "future" responses do not violate their hard and/or soft constraints—e.g., charge rate, temperature limit, capacity parameters, and/or anode overpotential.

Figure 8:
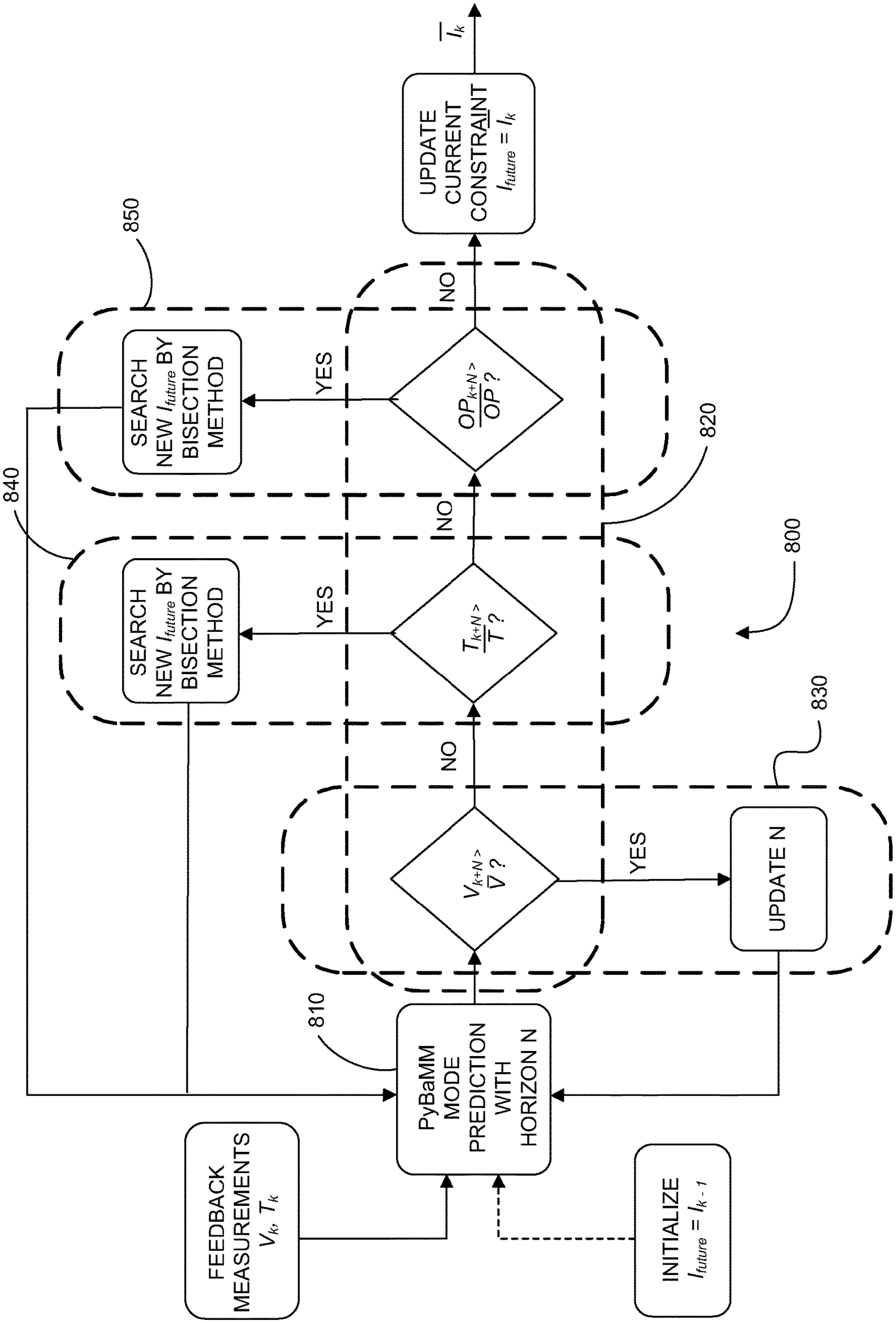
FIG. 8 is a flow diagram illustrating one possible method of operating the model predictive controller of FIG. 7 to produce a charge current constraint accounting for predicted anode overpotential, predicted battery temperature and predicted battery voltage.

FIG. 8 shows a method 800, which may include a numerical searching technique, of generating a charge signal current magnitude, which may be implemented in the SCLG portion of the MPC of FIG. 7. In FIG. 8, $\bar{*}$ means the upper constraint or threshold value of the variable *, and the dash line indicates the signal flow may only happens once at initialization, and all subscripts represent the time step. The method first involves predicting various battery responses using various battery parameters (operation 810). For example, the SCLG applies the feedback signals (V(k), T(k)), which may also include SOC(k) in some arrangements and a previous charge current value I(k−1), in the respective models, such as the SOH, SOC and/or Battery Temperature models (or model) and predicts the battery cell responses at time step k+N (e.g., T(k+N), and AOP(k+N)). As noted, other responses such as V(k+N) may also be predicted.

The method then begins assessing the various predicted constraint responses against their respective constraints (operation 820) and altering some parameters when a respective constraint is not met. When a constraint is not met, the MPC revaluates the predicted constraint not meeting its constraint after the parameter is altered in a way intended to move the predicted constraint in a direction that will allow it to meet its constraint value. In some cases, the SCLG reduces I(k+N) and reassess, and then commands the charge current at whatever value meets the various constraints.

In one possible example, the MPC first evaluates whether a predicted voltage will exceed a threshold voltage constraint (operation 830). Here, If V(k+N) is over the voltage threshold value, the system may reduce the prediction horizon N and then revaluate. Reducing the prediction horizon may happen during the controlled current phase of charging, where the voltage keeps increasing monotonically under a constant charging current over the future horizon N. When V(k+N) is over the threshold, an updated N', set as a half of the original N, will be applied to repeat the voltage prediction. In this way, the predicted voltage V(k+N') is naturally less than V(k+N) due to a shorter prediction horizon. This reduced horizon N' will be repeatedly applied in the subsequent current constraint determination process that follows right after the voltage prediction. The assessment of voltage may be done intermittently, only during a constant voltage stage of charging, or not performed, depending on the implementation. For example, in some charging systems, the MPC may be employed to manage charge between some lower limit, e.g., at the start of charge or at 0% SOC, and some upper limit. At the upper limit, the charging system may employ a charge scheme akin to maintaining a constant voltage at the battery terminals, which may involve steadily reducing charge current toward the end of charge to maintain the voltage at or below some threshold. The upper limit triggering the change in charge schemes in such a situation may be based on SOC, may be based on measured terminal voltage reaching some threshold, or otherwise.

In operations 840 and 850, the MPC evaluates the predicted temperature T(k+N) and the predicted anode overpotential (AOP(k+N)). As an initial matter, if T(k+N) and AOP(k+N) are both within their respective constraints, no change to the charge current constraint is needed, and the SCLG maintains the charge current constraint as the one being initialized or the one at the previous time step k−1. The optimizer 710 takes the current constraint and generates the current control command I(k).

With regard to temperature specifically, in operation 830, if T(k+N) violates its constraint (e.g., the predicted temperature exceeds a temperature threshold), the SCLG will reduce the charge current and then reassess whether reducing the charge current causes the predicted temperature to meet the constraint limit. In general, reducing charge current will act to reduce the rate of battery temperature increase and thus reduce the predicted T(k+N). In an MPC (the SCLG) with a voltage threshold constraint, it will be recognized that reducing current will not cause the battery terminal voltage to increase, so reducing charge current to meet the temperature constraint would not cause the system to violate the voltage constraint.

In one particular example, the SCLG updates the future current input ($\bar{I}(k)=\bar{I}(k+1)= \ldots =\bar{I}(k+N-1)$) using a bisection method. The bisection method is an iteration action that searches a target point within some boundaries. In one possible example, each iteration involves finding a midpoint within the boundaries that are updated from the previous iteration. Therefore, a midpoint and two boundaries keep updating during the search till the midpoint touches or gets close enough to the target. Here, in the case where the predicted temperature (or anode overpotential) violates their constraints, the bisection method involves finding a current that is less than it was and meets the temperature constraint (or anode overpotential constraint, discussed in more detail below). The bisection technique begins with setting or otherwise considering an upper bound of the current constraint to be the previous current value, i.e., I(k−1), and setting the lower bound as 0. In such a case, the updated current will always be less than the previous current value. In one example, the first midpoint of the bisection iteration is at ½*I(k−1). Next, this midpoint will be applied as the future current to test whether the predicted temperature (or anode overpotential in the subsequent operation) will violate its constraint. If necessary, a second iteration of the bisection method will start depending on how the new prediction goes:

(1). If ½*I(k−1) is too small, i.e., T(k+N) or AOP(k+N) is safe, the new upper bound of the current constraint will keep the same, that is, it is the value of I(k−1), and the lower bound will be updated by the previous midpoint, ½*I(k−1), and an updated midpoint will be calculated as ½*(½*I(k−1)+I(k−1))=¾*I(k−1);

(2). If ½*I(k−1) is too large, i.e., T(k+N) or AOP(k+N) now violates the constraints, the new lower bound keeps the same while the upper bound needs to be updated as the previous midpoint, ½*I(k−1). Then the new midpoint, naturally, will be ¼*I(k−1). If and when the predicted temperature does not violate its constraint, then the SCLG proceeds to check whether the voltage overpotential meets its constraint. The SCLG can assess voltage overpotential prior to temperature and overpotential prior to temperature, in various possible alternatives.

With regard to anode overpotential, at operation 850, the SCLG determines whether the predicted anode overpotential AOP(k+N) violates its constraint. When $\bar{I}(k)=\bar{I}(k+1)= \ldots = \bar{I}(k+N-1)$) is adjusted so that the predicted temperature meets its constraint, the adjusted $\bar{I}(k)=\bar{I}(k+1)= \ldots = \bar{I}(k+N-1)$) value is used to assess whether AOP (k+1) meets its constraint. If anode overpotential meets its constraint (e.g., >0), the SCLG uses the charge current value from the preceding operation. If anode overpotential does not meet its constraint (e.g., <0), the SCLG iteratively reduces the future current constraint and reassess the predicted anode overpotential until a charge current constraint is found that meets the anode overpotential constraint. It should be noted that reducing $\bar{I}(k)=\bar{I}(k+1)= \ldots =\bar{I}(k+N-1)$) whether or not $\bar{I}(k)=\bar{I}(k+1)= \ldots =\bar{I}(k+N-1)$) was not already reduced in the preceding operation, will not cause the predicted temperature to violate its constraint, or as noted above, cause the voltage to violate its constraint. Similarly, if anode overpotential is assessed prior to temperature, reducing it would not cause anode overpotential to violate its constraint. Like adjusting the charge current constraint to meet a temperature constraint, the SCLG may also use a bisection technique and iterate to a charge current constraint that will not violate the anode overpotential constraint. If and when the predicted anode overpotential meets its constraint, the adjusted current constraint is set as a current constraint $\bar{I}(k)$ and provided to the optimizer.

The charge current constraint is used by the optimizer, in conjunction with the SOC(error) to produce charge current magnitude that becomes the charge current by way of the signal constructor and/or charger.

In the operation of the SCLG depicted in FIG. 8, it should be recognized that the charge current constraint update is not necessarily changing at each time step or assessment horizon N during charging. For example, when the prediction T(k+N) and AOP(k+N) do not violate their hard constraints, the SCLG simply keeps the previous current input constraint and applies it for the next N time steps in actual charging. The SCLG can be configured to be inactive for some number of N time steps, which saves computation costs, power consumption, etc., or allows a lower cost processor to more slowly execute the various techniques over a relatively longer time horizon. However, when the SCLG does update the current input constraint at some time step k, the next time step when the SCLG to be active is not necessarily the same k+N. For example, the system may be configured to trigger the MPC at time step k+P (P<N) to leave the MPC enough robustness. The control parameter P is referred to as back-step number.

Figure 9A:
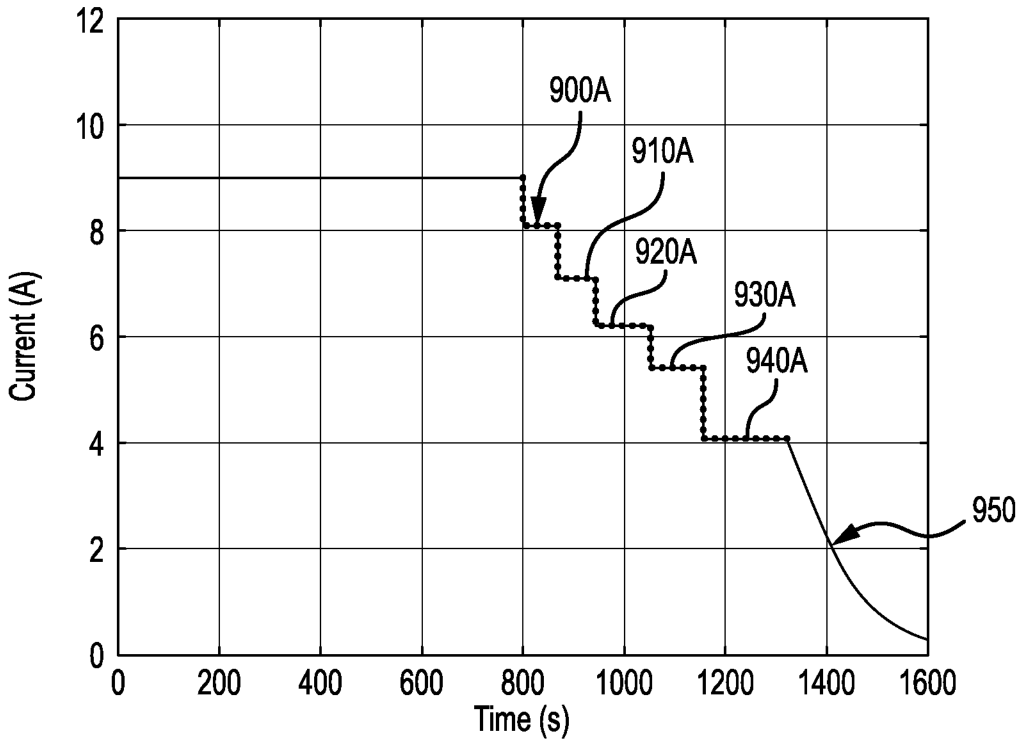
FIG. 9A is a charge signal diagram illustrating operation of the MPC of FIG. 7 to control charge current.
Figure 9B:
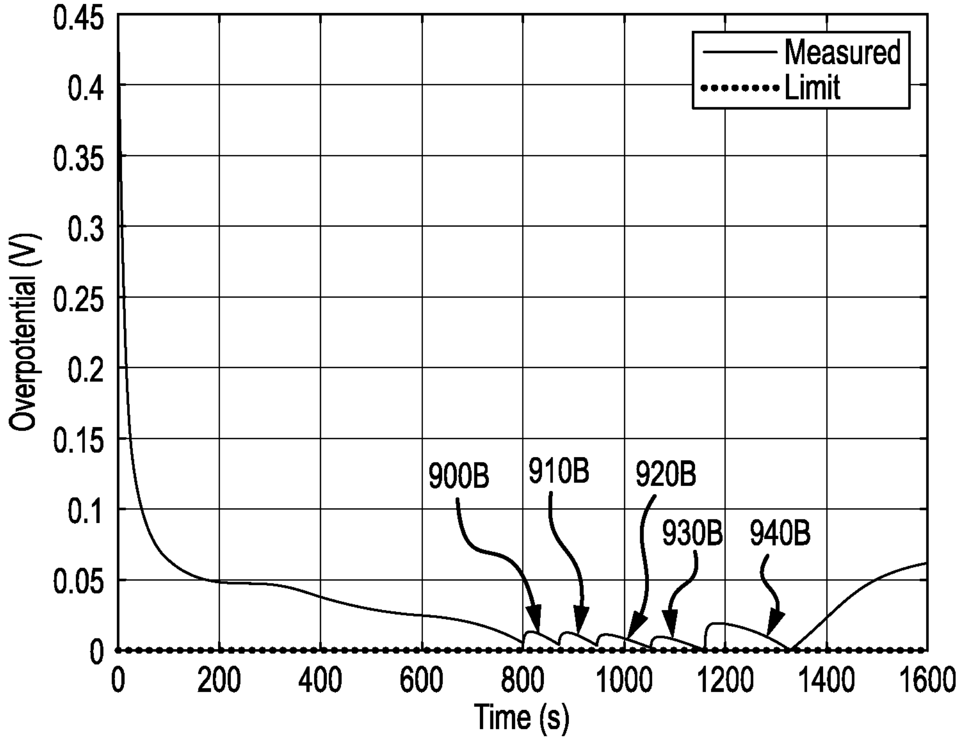
FIG. 9B is a diagram of predicted anode overpotential in relation to the MPC altering charge current responsive to the predicted anode overpotential.

FIGS. 9A and 9B illustrate the operation of the MPC according to the method of FIG. 8. The depicted MPC charge operation only illustrates changes based on predicted anode overpotential. In the upper diagram (FIG. 9A), a fast charge of a 30T Lithium-Ion battery is shown over a period of 1600 seconds. The initial charge rate is set at a 3 C rate, in the examples illustrated. This similarly sets I(k) or initializes I(k) at the start of charge at a charge current associated with 3 C for the battery cell. The charge is considered "fast" because it is occurring at about a 3 C charge rate, and thus at a charge current that exceeds a specified current of for the battery, which is typically specified at 0.5 C or 1 C, and the charge is thus occurring over only a period of 1600 seconds whereas charging at a 1 C rate would normally occur over a much longer period of 1 hour or a 0.5 C rate occurring over a 2 hour period. Fast charging in some cases is considered as anything above 0.5 C or 1 C, although other conventions are possible. The charge current to achieve various "C" rates involved in any of these examples depends on the battery type as well as other factors.

In FIG. 9A, it can be seen that the charge current, which would be I(k), is 9 amps for the first 800 seconds. At 800 seconds, the current control/charge current steps down from its upper charge current value of 9 amps. During the first 800 seconds, charging is occurring at a steady 9 amps (so the MPC has not adjusted current). With reference to FIG. 9B, it can be seen that the MPC is predicting anode overpotentials within the constraint, which predictions start relatively high at about 0.45 at the start of charge, decreases to about 0.05 over the first 200 seconds, staying above 0 and thus meeting the constraint until about 800 seconds. As such and as noted above, the MPC does not alter the charge current because at the charge current the predicted anode overpotential meets its constraint (>0V). As such, at the "fast" charge rate, the SOH is not being degraded (at least as SOH pertains and correlates to anode overpotential) for the first 800 seconds.

Referring to both FIGS. 9A and 9B, it can be seen that as the anode overpotential approaches its constraint at 0 volt at 800 seconds, the MPC decreases the charge current (the first step down 900A in FIG. 9A), which cause the predicted anode overpotential to increase 900B and stay above its lower constraint. As charging continues at the decreased charge current (8 amps), the anode overpotential again starts to approach 0, and the MPC repeatedly decreases current in subsequent steps (910A-940A) each time the anode overpotential approaches its constraint, resulting in the predicted anode overpotentials (910B-940B) at each corresponding step increasing above the constraint threshold. Near the end of charge, the current steps down to 4 A, and the anode overpotential stays above 0, from about 1150 seconds until about 1350 seconds where the anode overpotential again approaches zero. While not shown, this end of sequence may be marked by or triggered by a rise in the terminal voltage. For example, a "constant voltage" charge end of charge sequence may be initiated when the measured feedback terminal voltage has reached its constraint, e.g., 4.2V for the example 30T cell. When this happens, a separate PID may take over from the MPC until charging completes.

Here, the charge current may be continuously lowered trying to maintain a terminal voltage and until charging ends, which is shown here at 1600 seconds. As noted, the end of charge sequence may be managed by the MPC or it may be a distinct process within the MPC or a separate controller. The end of charge may be triggered by some lower current value, a measured threshold voltage, or other criteria. It can be seen, that the MPC managed the charge current in a way that maintained the anode overpotential above 0 by stepping down the charge current. As noted above, the charge current at any of the various steps may be defined through a bisection technique. In such a charge situation, charging may progress in a way that minimizes lithium plating, which optimizes lithium available for charge and discharge of the battery, and which has the various benefits discussed herein including maintenance of capacity of battery cycles and overall battery safety and efficiency.

In some possible examples, the constant voltage phase is initiated only when the measured terminal voltage, or so-called "actual voltage", reaches or exceeds its constraint (e.g., 4.2 volts). In the operation of the MPC, the voltage prediction happens, each time, at the beginning of the current constraint update process (e.g., the method of FIG. 8). This prediction may result in a high terminal voltage (higher than its threshold) and then triggers the update of the prediction horizon N for this time. All variables calculated by prediction are just in "future prediction", which only exists in MPC's calculation memory rather than what have been actually measured. Therefore, whenever the MPC is predicting voltage and no matter what the prediction result is, the actual terminal voltage is still below its threshold, and the "constant voltage" sequence has not yet been initiated.

In the examples of FIGS. 9A and 9B, the MPC tracked and managed the charge rate, and the predicted anode overpotential was maintained at a positive voltage during the charging process. While not illustrated, the MPC may also manage charging using predicted temperature to similar results.

Figure 12:
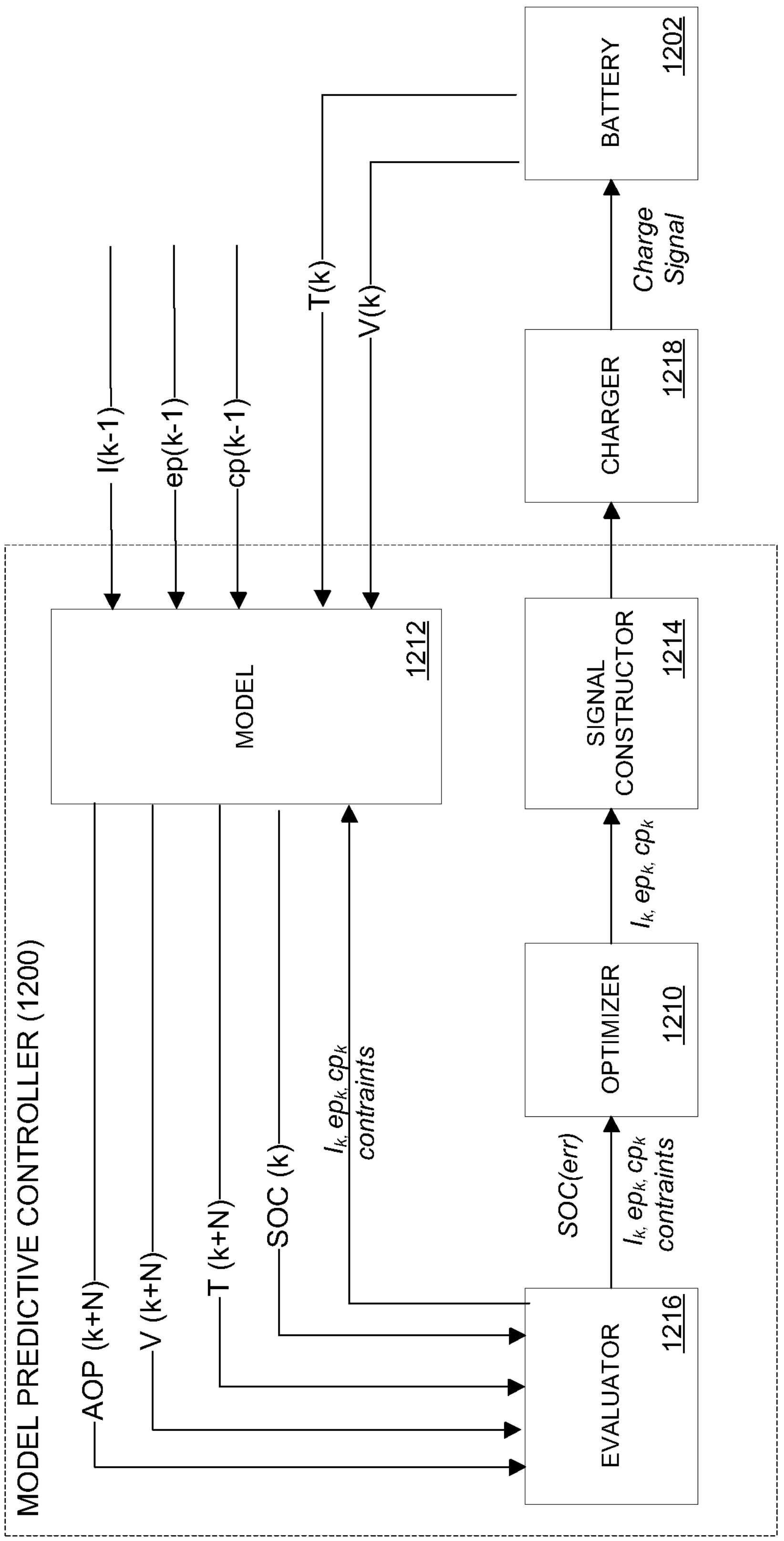
FIG. 12 is a system diagram of a model predictive controller and an associated battery system in accordance with one embodiment.

FIG. 12 illustrates an alternative model predictive controller architecture, which may be considered a model predictive control (MPC) system. The example MPC of FIG. 12 is similar to the example of FIG. 7 discussed above, with many blocks having the same functionality discussed above taking into account the difference in the method discussed with regard to FIG. 13, which includes the added functions of controlling additional charge signal attributes. Here, like in FIG. 7 and the technique of FIG. 8, the evaluator 1216 will receive as inputs a predicted anode overpotential (AOP (k+N)), predicted temperature, predicted voltage (V(K+N)), and state of charge (SOC(k)), and will produce an SOC(err) and current constraint ($\overline{I}$(k)) but will also produce additional charge signal constraints (discussed more extensively below), which are transformed by the optimizer, such as through a cost function, to charge signal controls to produce a charge waveform, including repeating charge signals, to charge the battery.

The control and signal flow in the system of FIG. 12 at a current time step k can be described as a loop: from the battery 1202, the system receives a measured temperature T(k), a measured terminal voltage V(k) and the current control input of the previous time step I(k−1), along with additional charge signal parameters from the previous time step such a parameter ep(k−1) related to edge time, and a parameter cp(k−1) related to body time (discussed in more detail below); the controller 1200 processes the received signals, along with state of charge tracking information, and generates the control input command I(k), which is the mean current magnitude at the current time step k, and also generates additional charge signal information ep(k) and cp(k), based on constraints of the same; the charger 1218 takes the commands I(k), ep(k) and cp(k), generates the actual current control signal and sends them to the battery 1202 as a charge current. The control signal is also based on a predicted anode overpotential, a predicted temperature and an estimate of state of charge.

The MPC system involves an evaluator 1216 that processes a predicted anode overpotential AOP(k+N), a predicted temperature T(k+N), and an estimated state of charge SOC(k). In one possible implementation, the evaluator may also receive or otherwise use a charge rate command or setting, a temperature limit (or temperature range), a reference SOC, which may be set or derived from the charge rate or other values, and/or a capacity range, which information may be preset, received from a user interface, or received or accessed from some other component (e.g., the system or environment in which the MPC is operating). AOP(k+N) and T(k+N) represent the predicted anode overpotential and the predicted temperature over a prediction horizon N, and SOC(k) indicates the estimated SOC at the current time step k. The evaluator may include two functions: (1) determine or evaluate an SOC tracking error, which may be managed by a tracking controller part of the evaluator; and (2) update the charge current control input constraints in real time. For (1), a comparison may be made between the estimated SOC, SOC(k) and the reference SOC, and the difference is calculated; for (2), a signal constraint law generator (SCLG), which may be a distinct functional block of the evaluator, produces a current constraint based on the predicted anode overpotential and the predicted temperature evaluated against there respective constraints, which may also consider a predicted battery voltage evaluated against a constraint. The SCLG also produces additional charge signal constraints, e.g., ep and cp, that are used in addition to the current constraint, to produce the charge signal and waveform applied to the battery.

The MPC also includes an optimizer 1210, which may be an MPC core that realizes the SOC tracking in an optimal way while considering the current and/or SOC constraints from the evaluator. In one example, the optimizer 1210 uses the real-time current input constraint, $\overline{I}$(k), the real time charge signal shaping constraints $\overline{ep}$(k) and $\overline{cp}$(k), and the SOC tracking error $e_{SOC}$(k). The optimizer focuses on looking for the future control series, {I(k), I(k+1), . . . , I(k+$N_c$−1)}, {ep(k), ep(k+1), . . . , ep(k+$N_c$−1)}, and {cp(k), cp(k+1), . . . , cp(k+$N_c$−1)} that are able to optimally minimize a cost function while ensuring the future control series respects the constraints.

The optimizer 1210 eventually only implements the first value of the future control series, i.e., I(k), and ep(k) and cp(k) as the control input commands for the current time step k and sends those to the signal constructor 1214, which produces the charge signal alone or in combination with the charger 1218.

The predictor 1212 takes as its inputs T(k), V(k) from the battery 1202 and the adjusted future control input current constraint series {$\overline{I}$(k), $\overline{I}$(k+1), . . . , $\overline{I}$(k+N−1)}, {$\overline{cp}$(k), $\overline{cp}$(k+1), . . . , $\overline{cp}$(k+N−1)} and {$\underline{ep}$(k), $\underline{ep}$(k+1), . . . , $\underline{ep}$(k+N−1)} from the SCLG or more generally the evaluator, and calculates the future AOP(k+N) on some prediction horizon N. The prediction may happen multiple times in a single time step. To initialize this process, the SOH predictor 1212 takes the previous mean current input I(k−1) and the previous charge signal shape control parameters ep(k−1) and cp(k−1) and expands them to a current series {I(k−1), I(k−1), . . . , I(k−1)} and shape series {cp(k−1), cp(k−1), . . . , cp(k−1)} and {ep(k−1), ep(k−1), . . . , ep(k−1)} with the lengths of N, based on which the SCLG then generates and adjusts the future control signal constraint series.

The predictor 1212 also takes as its inputs T(k), V(k) from the battery 1202 and the adjusted future current constraint series {$\overline{I}$(k), $\overline{I}$(k+1), . . . , $\overline{I}$(k+N−1)}, {$\overline{cp}$(k), $\overline{cp}$(k+1), . . . , $\overline{cp}$(k+N−1)} and {$\underline{ep}$(k), $\underline{ep}$(k+1), . . . , $\underline{ep}$(k+N−1)} from the SCLG, and calculates the future T(k+N) on some prediction horizon N. The prediction may happen multiple times in a single time step. To initialize this process, the SOH predictor 712 takes the previous mean current input I(k−1), the previous waveform shape control parameters ep(k−1) and cp(k−1 and expands them to a current series {I(k−1), I(k−1), . . . , I(k−1)}{cp(k−1), cp(k−1), . . . , cp(k−1)} and {ep(k−1), ep(k−1), . . . , ep(k−1)} with the length of N, based on which, the SCLG then generates and adjusts the future charge signal constraint series.

The battery SOC estimator, which may also be implemented in the predictor 1212 or may be a distinct component 708, estimates the SOC for the current time step k by applying the measured T(k), V(k) from the battery 1202 and the current control input I(k) and the previous control input I(k−1) from the charger 1218. A simplified extended Kalman Filter (EKF) may be used for the battery SOC estimator 1208.

Besides the shape of the leading edge of the charge signal (discussed with regard to FIG. 1), aspects of the present disclosure may involve a system that may also generate a shaped charge signal with a controlled current magnitude, rest time and duty cycle. Returning to the example charge signal of FIG. 2, a charge current waveform may be characterized using four time-related parameters—charge signal period, edge time (ET), body time (BT) and rest time (RT).

The edge time parameter represents a leading edge of charge waveform between the initiation of a charging current, which may initially be zero amps but may also be some non-zero value, and when the charging current reaches a steady state charge current, which is also the time of the beginning of the body time. The leading edge of the edge time may be sinusoidally shaped or an approximation thereof, as shown, and be defined based on the ET.

Figure 2A:
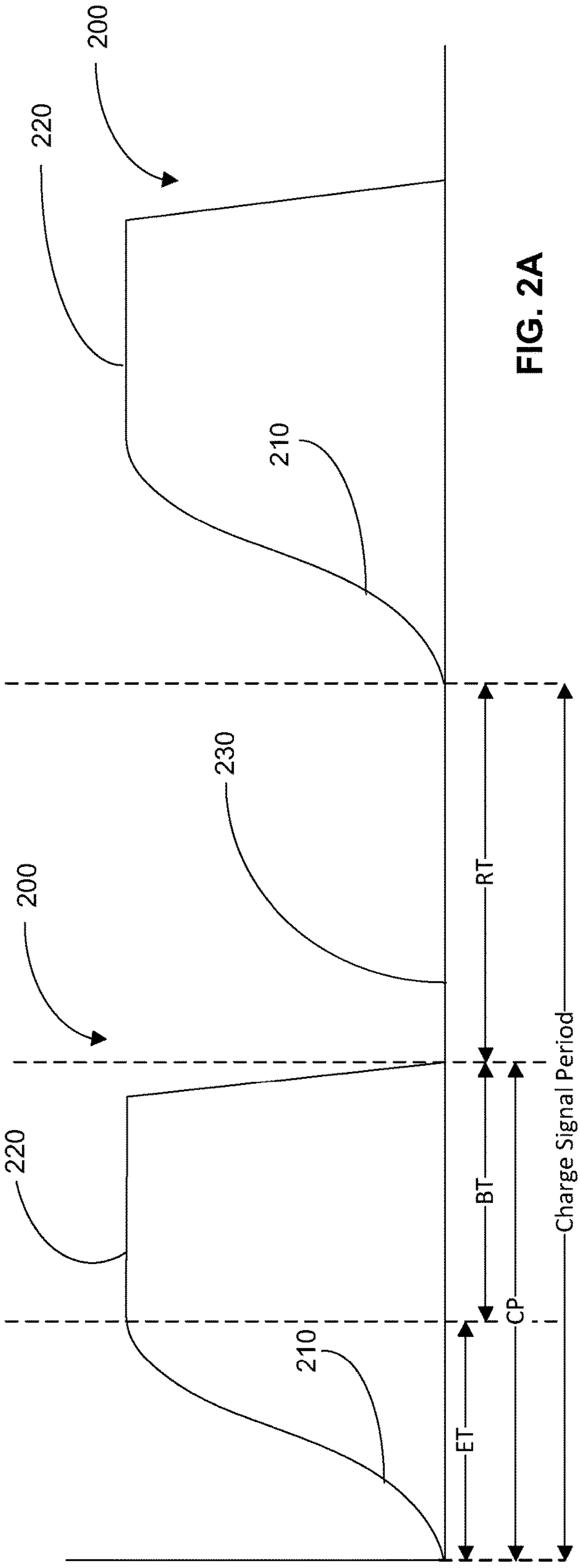
FIG. 2A is a signal graph of an example a controlled arbitrarily shaped charge waveform for charging a battery in accordance with one embodiment
Figure 2B:
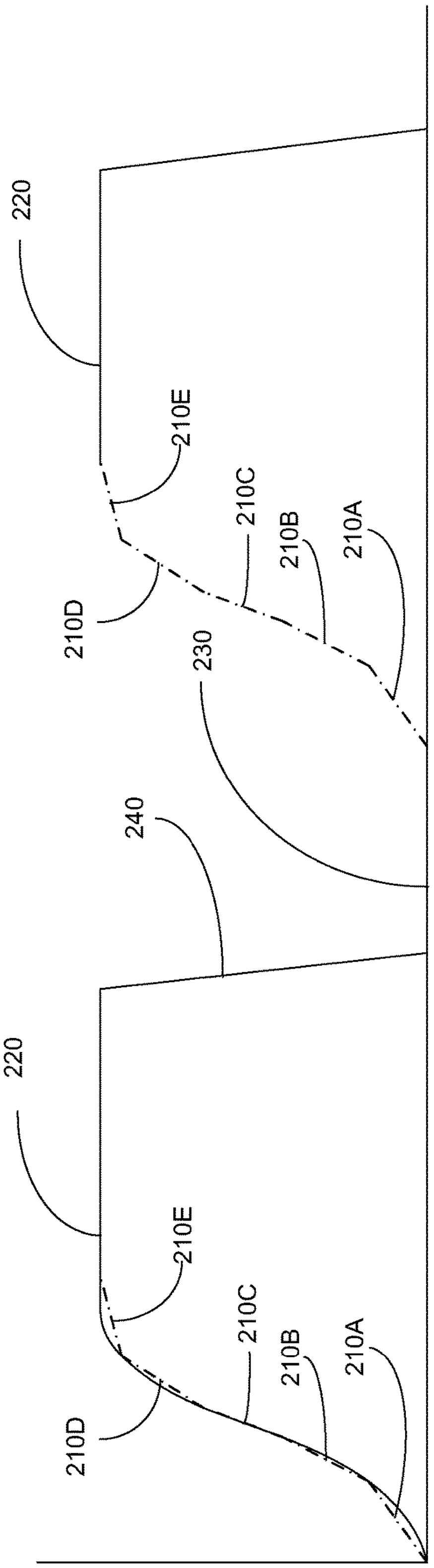
FIG. 2B is a signal diagram of a sequence of shaped charge signals generated from a battery charge circuit in accordance with some embodiment, the shaped charge signals including shaped leading edges with linear segments collectively approximating a non-linear shaped leading edge.

Relative to the technique discussed with regard to FIG. 1, FIG. 12 or otherwise, the leading edge may also be one or more linear segments as shown in FIG. 2B, noting FIG. 2B also illustrates a waveform with a similar ET, longer BT, shorter RT and shorter duty cycle as compared to the waveform shown in FIG. 2A. The leading edge may be in the form or approximate the shape of a sinusoid at some frequency (half of 180 degrees) of a sine wave (or cosine wave) or may otherwise be shaped approximately of the shape of such a rising edge of sinusoid. Further, as noted and as illustrated in FIG. 2B, the shaped leading edge may be formed of linear segments, the collection of which approximate a sinusoidal leading edge 210. In such an arrangement, a first linear segment 210A increases voltage (which may also correlate with an increasing charge current) relatively slowly as compared to a square pulse, for example, where there is an immediate sharp increase in voltage and charge current of about 90 degrees, which approximates a very high frequency sinusoid. The following linear segments 210B-210E are linear approximations of the shaped-leading edge, which is included/retained in the first charge signal period for comparison and not-included in the second charge signal period. For comparison purposes, the rest period 230 of FIG. 2B is relatively shorter than the rest period of FIG. 2A. The overall charge period of the two charge signals comprising both the leading edge 210 period and the body 220 period is also relatively longer in FIG. 2B as compared to FIG. 2A, again for comparison.

In one example, the leading-edge shape is based on the determination of the edge time (ET). Various well known mathematical relationships exist between the magnitude (x) of a sinusoid and time (t), which may be used to determine a frequency. The system may then, as noted herein, generate a leading edge shape based on that frequency. As further noted herein, the system may generate various approximations of such a shape, which may include one or more linear segments collectively approximating the sinusoidal frequency.

A similar MPC arrangement can be applied to more complicated scenarios, e.g., the cases where further optimization of the charge current waveform is desired. In these cases, not only can the current input magnitude be adjusted, but an MPC may alter time-related waveform parameters (edge time, body time and rest time) in real-time during charge. In such a situation, the leading-edge shape may also be something besides a square edge associated with a square pulse.

In one possible arrangement, the MPC models (e.g., anode overpotential and temperature models) may be defined or refined through a waveform parameter sensitivity analysis (WPSA), which is used to understand how time-related current waveform parameters affect the battery cell charging responses (cell temperature, anode overpotential, charge voltage, etc.). The principle of WPSA is to repeat numerical simulations of the battery cell charging process by distinct combinations of the current waveform parameters and compare the simulated cell responses. All numerical simulations can be done using the PyBaMM model or models. In each WPSA simulation test, the charge current input is set to be a charge waveform with a sequence of charge signals each having a mean current, edge time, body time and rest time. The charge signals may also have some leading-edge shape, which may be a function of the edge time. The average or mean current may be of the active parts of the charge signal (the edge time and body time) or may include the rest time and thus the entire duty cycle of any charge signal.

In one example, the following charge signal variables are defined:

- Wave time (t_wave): t_wave=edge time+body time+rest time. While many possible values are possible, for purposes of helping to describe the overall concepts of the present disclosure, one possible t_wave example might be 1 ms.
- Edge time portion (ep): ep=edge time/(edge time+body time). While many possible values are possible, for purposes of helping to describe the overall concepts of the present disclosure, one possible ep example might be 0.5.
- Charge time portion (cp): cp=(edge time+body time)/t_wave. While many possible values are possible, for purposes of helping to describe the overall concepts of the present disclosure, one possible cp example might be 0.6.

With the above examples of t_wave, ep and cp, a charge signal portion of a charge wave has a body time of 0.3 ms, and edge time of 0.3 ms, which translates to an edge frequency of 1666.7 Hz, at a duty cycle of 1 kHz for the repeating charge signals. In one possible example where the leading edge is shaped, the edge is a half period of a cosine waveform; therefore, the frequency to define the leading edge shape is 1/(2*T_wave*cp*ep). The parameter t_wave reflects the current waveform frequency, and the relativity concepts of ep and cp bring the benefit of less complexity on the time scale for the time-related waveform parameters.

Figure 10A:
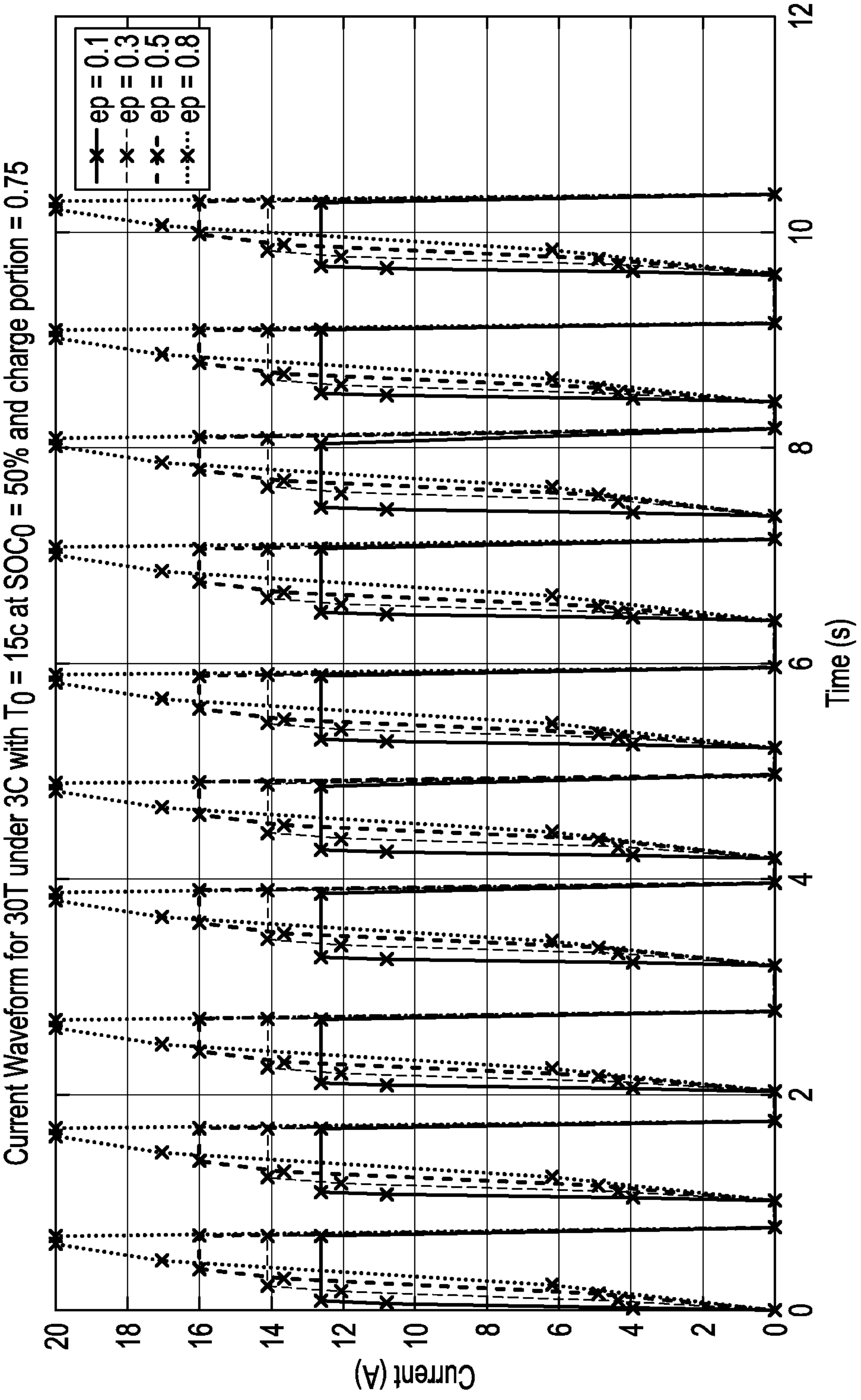
FIG. 10A is a charge signal diagram illustrating the effect of altering the ep parameter on the charge signal.
Figure 10B:
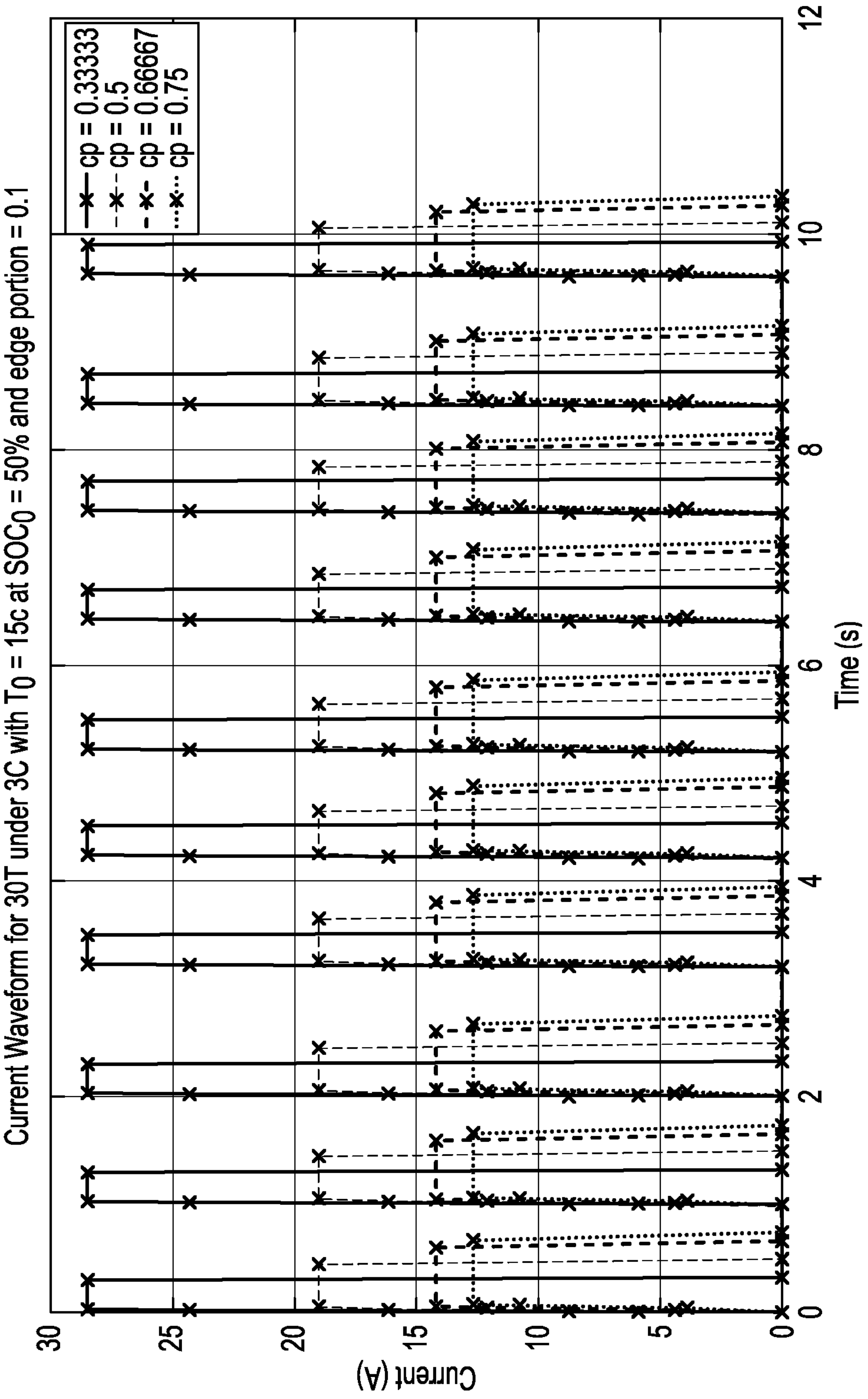
FIG. 10B is a charge signal diagram illustrating the effect of altering the cp parameter on the charge signal.
Figure 10C:
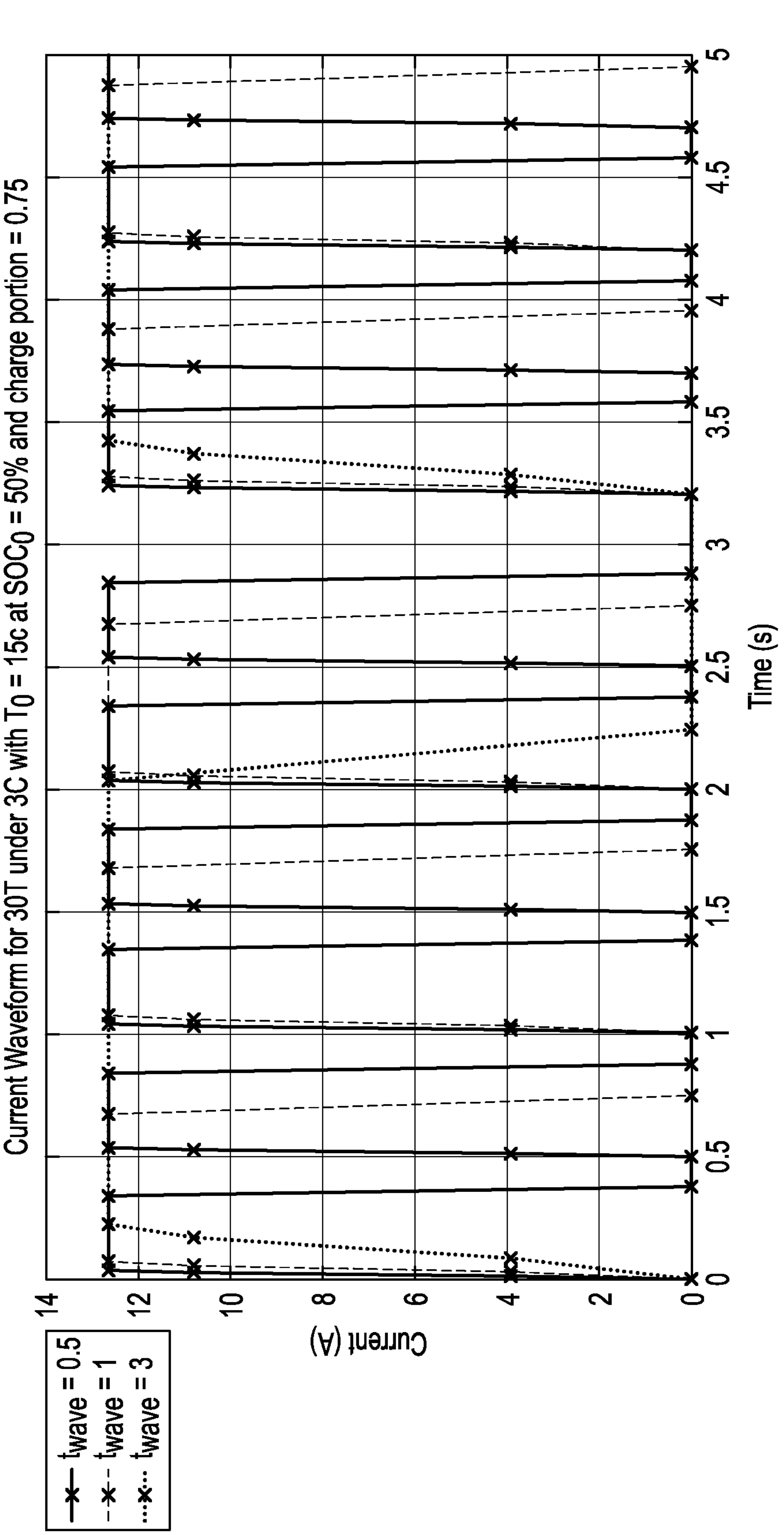
FIG. 10C is a signal diagram illustrating the effect of altering the t-wave parameter on the charge signal.
Figure 11A:
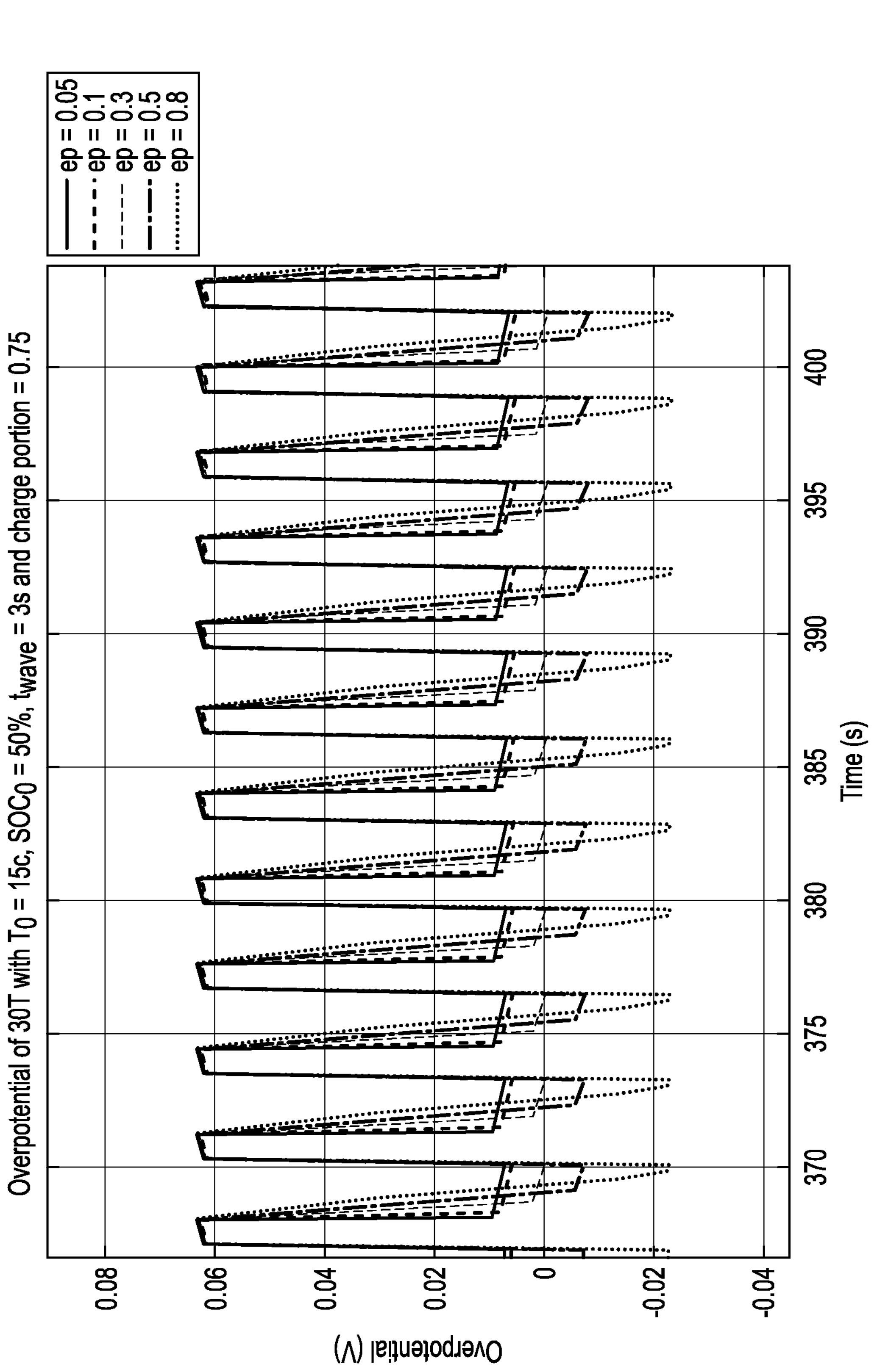
FIG. 11A is a signal diagram illustrating the effect of altering the ep parameter on the predicted anode overpotential.
Figure 11B:
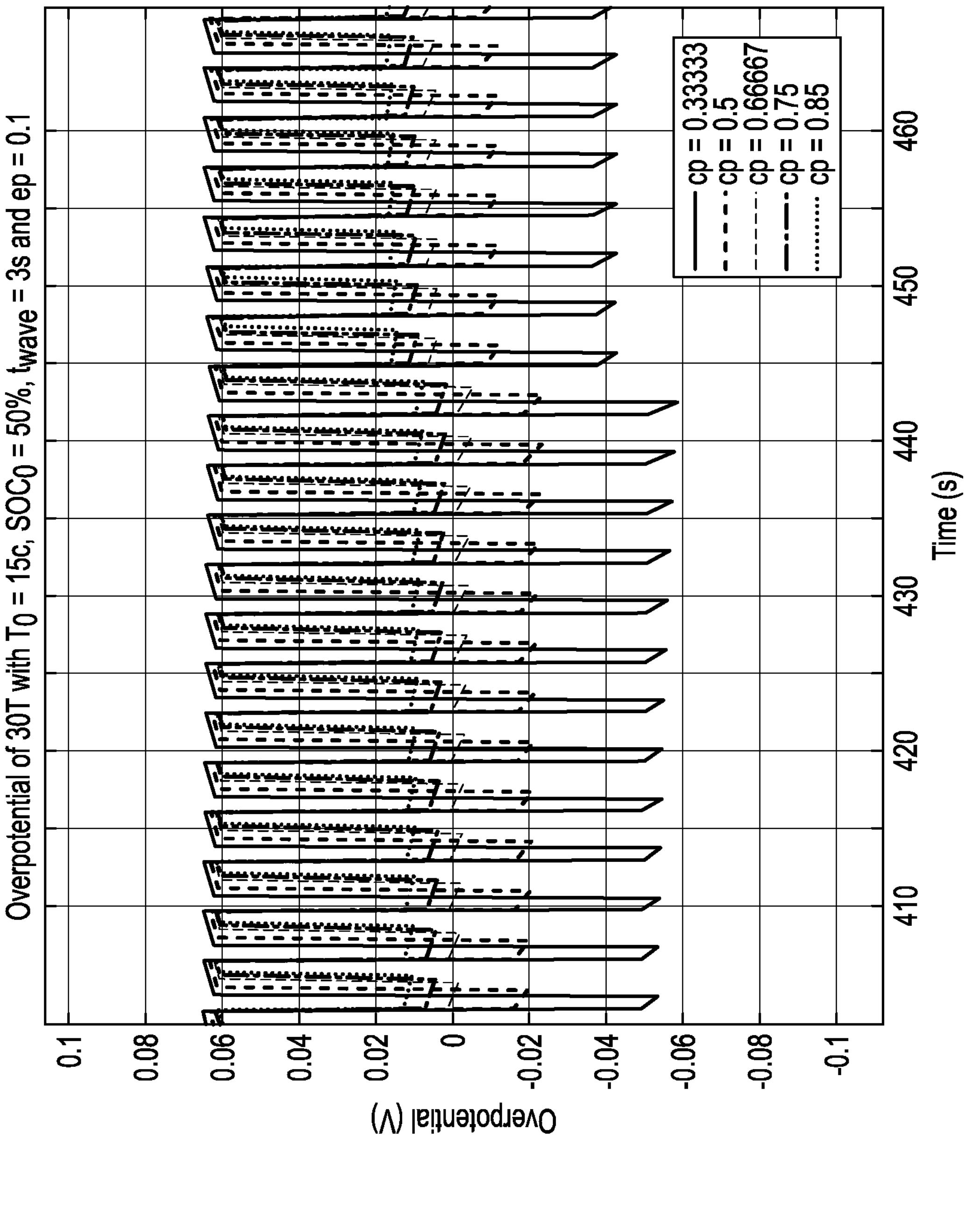
FIG. 11B is a signal diagram illustrating the effect of altering the cp parameter on the predicted anode overpotential.
Figure 11C:
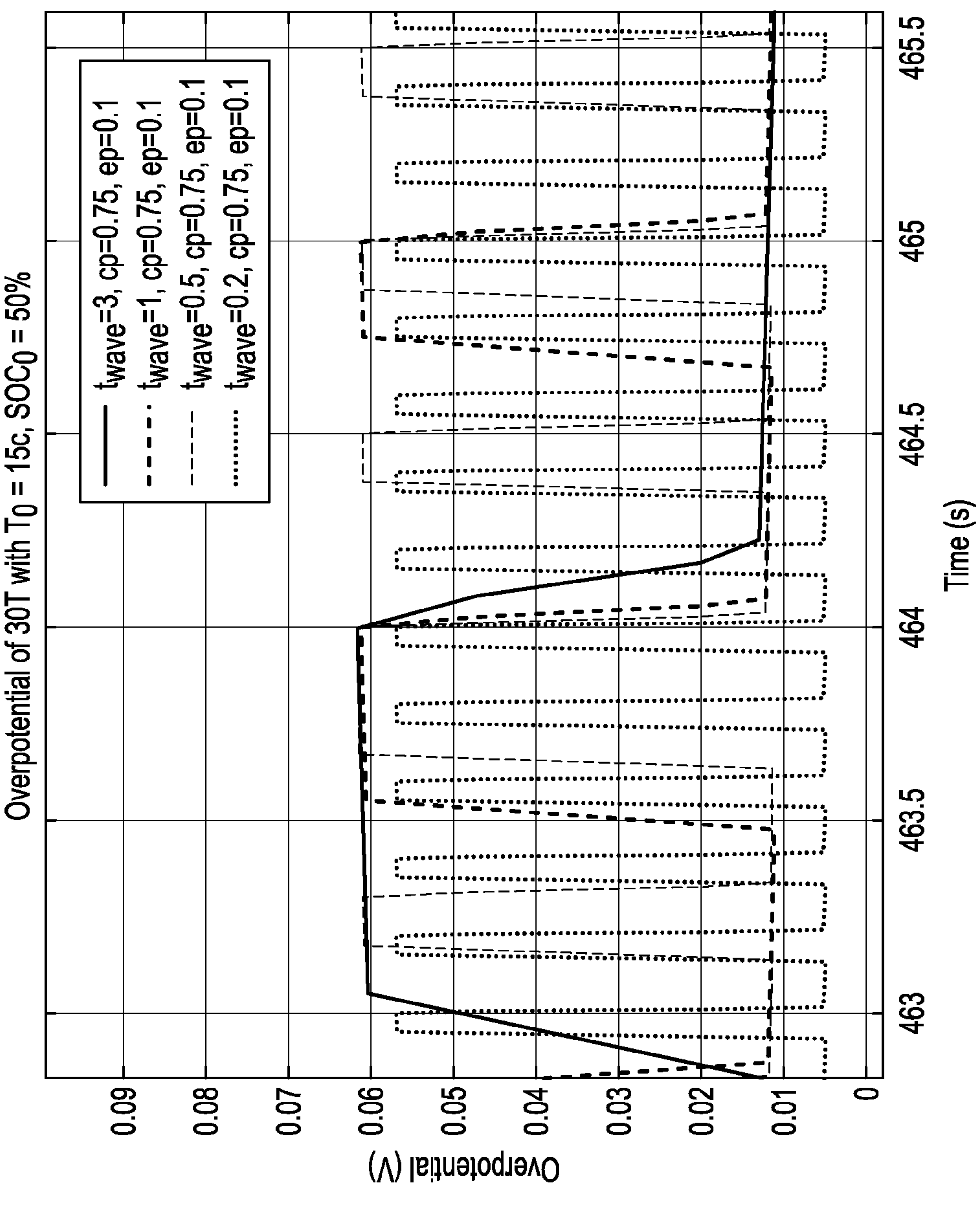
FIG. 11C is a signal diagram illustrating the effect of altering the t-wave parameter on the predicted anode overpotential.

The WPSA simulation comparison can be viewed in FIGS. 10A-10C, where various charge signals are shown and how alteration of a variable (ep, cp, and t_wave, respectively at FIGS. 10A-10C) affects the charge signal characteristics of edge time, body time, duty cycle, and rest time, and in FIGS. 11A-11C where it can be seen how anode overpotential is controlled and affected by alteration of the various parameters to form different charge signals (altering ep, cp and t_wave, respectively FIGS. 11A-11C)). FIGS. 10 and 11 are simulations and MPC operation for a 30T type Lithium-Ion battery, at a temperature of 15 C, an SOC of 50%, and at a 3 C charge rate with various other attributes as depicted in the figures. When viewing the simulations, it can be seen how the MPC can execute a method and run the models to adjust various parameters of the charge signal and affect whether or not the battery may be charged while maintaining the anode overpotential at greater than 0 volts, or what changes are effective at altering the anode overpotential or avoiding deleterious operation. FIG. 10A shows how ep changes the charge signal shape; according to the plots, when ep is smaller, the current waveform is shorter, and the shape of a single waveform is closer to a rectangle. In FIG. 11A, it can be seen how a relatively smaller ep values are more effective at avoiding an anode overpotential of zero or less. For example, an ep of 0.5 or 0.6 result in about a −0.01 or −0.02 anode overpotential whereas an ep of 0.3, 0.1 and 0.05 result in anode overpotentials of greater than 0. Similarly, FIGS. 10B and 10C illustrate how the charge signal is reshaped by cp and t_wave, respectively; and, FIGS. 11B and 11C illustrate how anode overpotential is affected by altering cp and t_wave. While not shown, alterations to the charge signal parameters may also alter terminal voltage during charge and predicted temperature, and changes to such parameters may be made in order to maintain hard and/or soft constraints.

According to the illustrated simulations, the effect of all time-related waveform parameters on anode overpotential can be estimated by:

$$cp > ep > t\_wave.$$

Thus, the cp parameter has the greatest effect on anode overpotential and the t_wave parameter has the smallest effect. In some embodiments, to simplify deployment of a charging system that uses an MPC to manage a shaped charging waveform, the evaluator may be tailored to manage and alter the cp and ep constraints and use a fixed waveform frequency—that is, t_wave is designed to be a constant. This is due to 2 observations: (1) t_wave does not affect anode overpotential as much as the other waveform parameters; and (2) the waveform frequency can only be restricted in a relatively small range in some applications due to limits on the ability of the signal constructor and/or charger to produce the waveform with the sequence of charge signals. Of course, it would also be possible to deploy a configuration that only alters one of the other two parameters, as well, and fixes one of the other two parameters. Since cp has the greatest effect on anode overpotential, for example, ep and t_wave might be fixed. While the discussion here focuses on anode overpotential, the same balancing and optimizing considerations may be applied to a temperature (or other constraints like voltage) alone or in combination with the anode overpotential constraint.

Like the controlled current MPC discussed with regard to FIGS. 7 and 8, the shaped charging waveform implementation of the MPC aims to manage a desired SOC/charge rate while constraining the cell temperature and anode overpotential under their limits. Therefore, the various components of the MPC of FIG. 12 are present with the evaluator and or optimizer including a different methodology for generating constraints and then using the constraints, such as through a cost function, to generate a charge signal.

In general, the MPC solves a real-time optimal SOC/charge rate tracking problem by calculating the actual mean current magnitude I(k), waveform shape parameters cp(k) and ep(k) within their time-varying constraints. Further, the MPC uses control input signal constraints by the designed constraint update laws. Referring again to FIG. 6, to produce a charge signal with the various attributes of cp, ep, etc., along with approximating or otherwise producing a shaped leading edge, the switch 612 or switches 612/614 may be controlled at the respective gate signals 630 and 632 to produce pulses at node 636. The pulses at node 636 are converted by the filter, 610, which may include an inductor 640, as well as a capacitor 648 and inductor 642. In a situation such as discussed with regard to FIGS. 7 and 8, where charge magnitude is primarily controlled, charge current may be controlled with the circuit shown in FIG. 6 or may also be generated by various possible boost or buck topologies, depending on the available power supply and other attributes of any given charge environment.

As discussed, the shaped charge signal version of the MPC is equipped with multiple control input signal constraints, with the objective of the SCLG to maintain hard and/or soft constraints. For example, the SCLG, though controlling charge signal characteristics may keep the predicted anode overpotential positive. In one implementation of the MPC, a PyBaMM model is applied to predict future cell responses be some defined prediction horizon N, and a bisection numerical searching algorithm is used to update the desired constraints and assess where the system can operate and meet the constraints.

Figure 13:
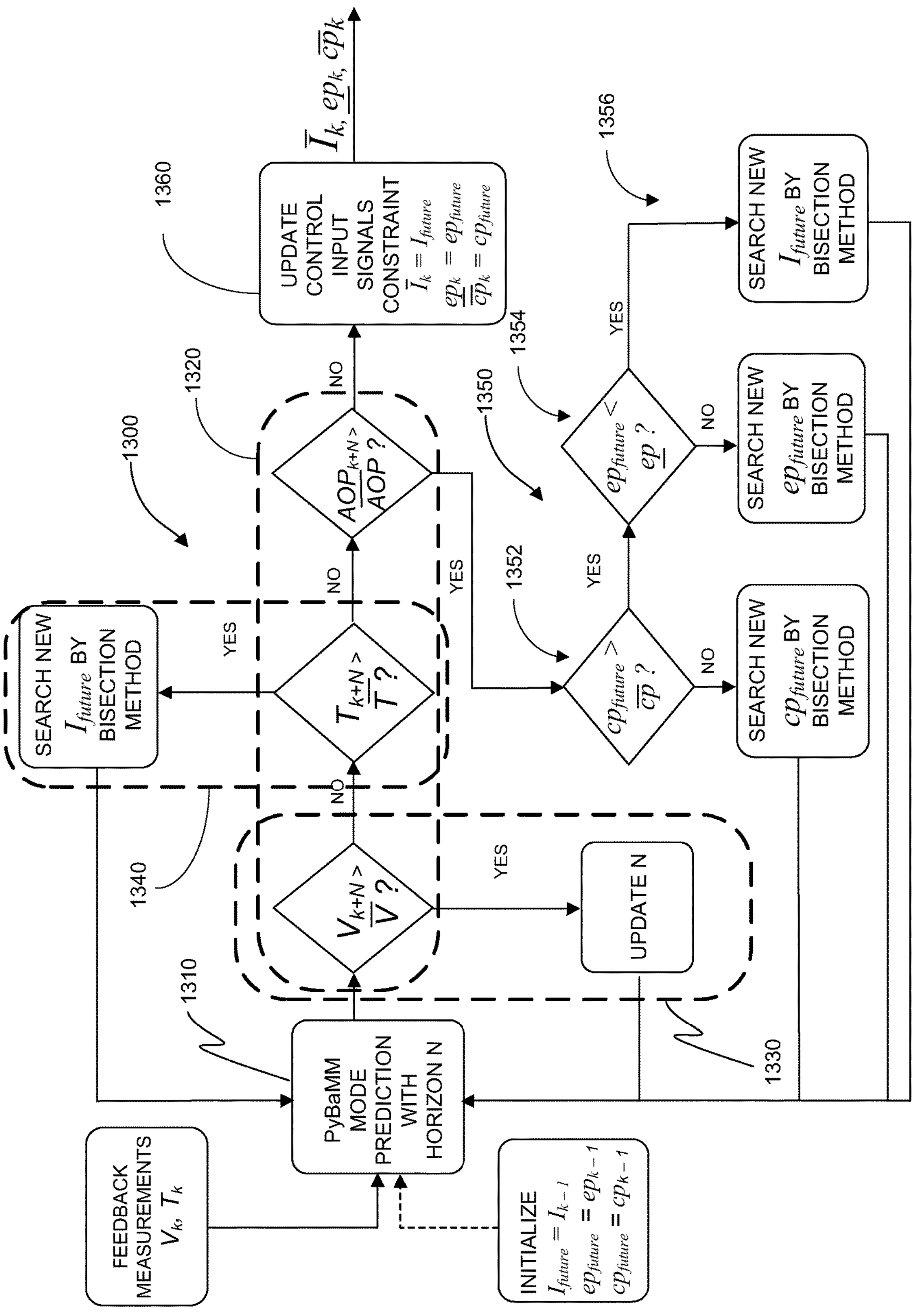
FIG. 13 is a flow diagram illustrating one possible method of operating the model predictive controller of FIG. 12 to produce charge signal constraints accounting for predicted anode overpotential, predicted battery temperature and predicted battery voltage.

FIG. 13 illustrates one possible example of a method 1300 of controlling various aspects of a charge signal to maintain constraints. The method is discussed with reference to an SCLG, which may be a part of the evaluator, illustrated in FIG. 12. Here, one model is shown which implements anode overpotential, voltage and state of charge prediction. As mentioned, an MPC may employ discrete models or an integrated model, or combinations. As such, the MPC of FIG. 12 may include discrete models as shown in FIG. 7.

In operation of the method, feedback signals (e.g., V(k), T(k) are applied to the model (operation 1310). The model or models may be configured to require different, fewer or more feedback signals. Additionally, the model may receive or otherwise use previous current input I(k−1) and previous waveform parameters ep(k−1) and cp(k−1) and/or be initialized with values of the same. The model, which may be a PyBaMM model, then predicts the battery responses at time step k+N (V(k+N), T(k+N), and/or AOP(k+N)).

The SCLG then goes on to evaluate the predicted values against constraints, and alter some aspect of charge such as some aspect of a charge signal when a constraint is not met (operation 1320). The order of predicted value analysis may be altered. Similarly, the same, fewer, more, or different predicted values and constraints may be assessed and managed by an MPC according to various aspects of the present disclosure.

In one possible aspect, the MPC first analyzes predicted voltage. As noted elsewhere, this operation may only occur during a constant voltage phase of charging in some arrangements. Similarly, the constant voltage phase of charging may occur through a different control scheme or as part of separate controller, like a PID controller. In some other alternatives, the system may not manage charge with reference to voltage.

With regard to predicted battery voltage V(k+N), if the predicted voltage exceeds a threshold, e.g., 4.2 volts, the SCLG reduces the prediction horizon N, reruns various predicted values, and reassesses the predicted voltage (operation 1330). If the predicted voltage meets its constraint, then the SCLG proceeds to analyze predicted temperature (operation 1340) and predicted overpotential (operation 1350). If both meet their constraints, the system proceeds with providing the charge signal constraints $\bar{I}(k)$, $\underline{ep}(k)$ and $\overline{cp}(k)$ (operation 1360) to the optimizer. When the predicted temperature does not meet its constraint, which may be an upper temperature limit, the SCLG may adjust the charge current by lowering what the intended charge current magnitude will be, and then reassessing the predicted temperature. In contrast, the SCLG adjusts ep and/or cp to adjusted anode overpotential if the predicted anode overpotential does not meet its value. In some arrangements, the SCLG may also adjust constraints ep(k), cp(k) and/or t_wave(k), in order to meet the predicted temperature constraint. The MPC may further also adjust the charge current in addition to the charge signal constraints $\underline{ep}(k)$ and $\overline{cp}(k)$ to meet the anode overpotential constraint.

With specific regard to the predicted temperature (operation 1340), if T(k+N) violates its constraint, the SCLG reduces the future mean current magnitude constraint ($\bar{I}(k)=\bar{I}(k+1)= \ldots =\bar{I}(k+N-1)$ by a bisection method, iteratively applied as discussed above, until the updated T(k+N) (at the updated current mean current values) reaches its constraint. Other techniques, as mentioned herein, may be used to iteratively reduce the charge current until the predicted temperature meets its constraint.

Once the predicted temperature meets its constraint, the SCLG proceeds to assess whether the anode overpotential meets its constraint, and if not, proceeds to alter various charge signal attributes until the constraint is met (operation 1350). As introduced above, in one possible example, the SCLG first attempts to alter $\overline{cp}(k)$, then attempts to alter $\underline{ep}(k)$, and then attempts to alter (e.g., reduce) the mean current magnitude constraint $\overline{I}(k)$, to bring the predicted anode overpotential within its constraint.

In more detail, if the predicted AOP(k+N) violates its constraint; the SCLG iteratively updates a future constraint $\overline{cp}(k)$ value (e.g., increasing the $\overline{cp}(k)$ constraint) until the new predicted anode overpotential meets its constraint or the cp constraint reaches a lower or upper bound (1352). The cp constraint value may also be updated through a bisection method. As with other values that are iterated to satisfy a constraint, the SCLG may use other techniques such as changing a value, here the cp constraint, by some integer, some percentage, etc.

If altering $\overline{cp}(k)$ is insufficient to cause the predicted anode overpotential to meet its constraint, the SCLG will begin altering $\underline{ep}(k)$ to meet the anode overpotential constraint (operation 1354). In one example, $\underline{ep}(k)$ may be iteratively reduced, noting that it has been observed that lowering $\underline{ep}(k)$ may increase anode overpotential bringing it within its constraint if it is 0 volts or less. The future $\underline{ep}(k)$ value may be altered through a bisection method or otherwise until the updated AOP(k+N) stays within its constraints or $\underline{ep}(k)$ reaches its lower/upper bounds.

When both the cp and ep constraints are insufficient to meet the AOP constraint, the SCLG attempts to reduce the future mean current magnitude constraint to meet the constraint. Here, in one example, the SCLG may iteratively reduce the mean current magnitude constraint until the predicted AOP is greater than 0 volts.

At the end of the method, the updated future mean current value, updated cp and updated ep constraint values are then used as the real-time control input signal constraints provided to the optimizer to generate the charge signal (operation 1360). Any of such values may not change, some combination may change, or all may change when the SCLG runs. In some instances, when alteration of the cp cannot meet the constraint, the last attempted updated $\overline{cp}(k)$ is then used for the charge signal when either $\underline{ep}(k)$ or the mean current constraints can successfully be altered to meet the constraint. Similarly, if alteration of $\overline{cp}(k)$ and $\underline{ep}(k)$ cannot meet the constraint, then the last attempted update of $\underline{ep}(k)$ is used for the charge signal. Finally, if alteration of the mean current cannot meet the constraint, then charging may be halted or charge control may transfer to a constant voltage or other charge scheme to complete charge.

In the flow chart of FIG. 13 $\overline{*}$ means the upper constraint or threshold value of the variable *, $\underline{*}$ means the lower constraint of the variable *, the dash line indicates the signal flow may only happen once at initialization, and all subscripts represent the time step.

While predicted anode overpotential and predicted temperature are discussed in some examples, the system may also employ models and employ methods to alter charge signal attributes to manage some predicted parameter such as plated-lithium concentration (correlates to lithium plating), solid electrolyte interphase (SEI) thickness (correlates to SEI growth, which during charging may be indicative of battery degradation), averaged negative particle crack length or rate (indicative of particle swelling and cracking) and loss of active material in the negative electrode within a respective constraint. In any such situation, a model may predict the battery parameter, an evaluator assess the predicted parameter against a constraint, an MPC alter a charge signal attribute (e.g., mean current, ep, cp, t-wave, frequency of the leading edge, etc.) and the MPC reassess the predicted parameter at the altered charge signal attribute, and run the charge at whatever charge signal attribute allows the constraint (or constraints) to be met.

In the optimizer, the constraints from the evaluator and the SOC(err) are optimized to produce charge signal commands for generating a charge signal with a mean current magnitude, an ep and a cp, at a value of t-wave that may be fixed. As noted, additional or different constraints may be determined and used by the optimizer. The optimizer implements a cost function:

$$J(k) = \sum_{i=1}^{N_p} w_{p_i} e_{SOC}^2(k+i) + \sum_{i=1}^{N_c} \big(w_{cI_i}(I(k+i-1) - I_{ref}(k))^2 + w_{ccp_i}(cp(k+i-1) - \overline{cp}(k))^2 + w_{cep_i}\big(ep(k+i-1) - \underline{ep}(k)\big)^2\big),$$

where:

$N_p$ is the MPC prediction horizon on the SOC tracking error, $N_c$ is the MPC prediction horizon on the control input, $w_{p_i}$, $w_{cI_i}$, $w_{ccp_i}$ and $w_{cep_i}$ are the weights for the SOC tracking error and the control inputs, respectively, and $I_{ref}(k)$ is the desired or reference current charge rate.

Figure 14:
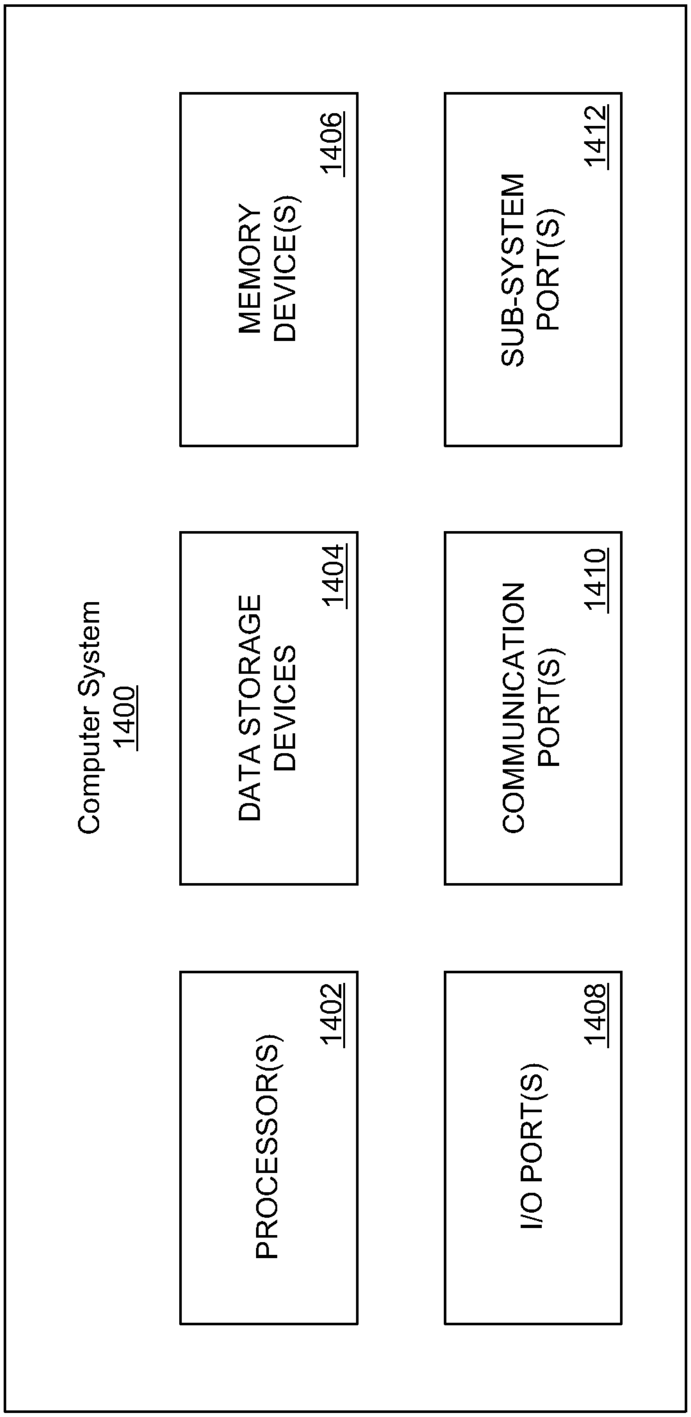
FIG. 14 is a diagram illustrating an example of a computing system which may be used in implementing embodiments of the present disclosure.

Referring to FIG. 14, a detailed description of an example computing system 1400 having one or more computing units that may implement various systems and methods discussed herein is provided. The computing system 1400 may be part of a controller, may be in operable communication with various implementation discussed herein, may run various operations related to the method discussed herein, may run offline to process various data for characterizing a battery, and may be part of overall systems discussed herein. The computing system 1400 may process various signals discussed herein and/or may provide various signals discussed herein. For example, battery measurement information may be provided to such a computing system 1400. Some aspects of an MPC may be implemented by such a computing system. The computing system 1400 may also be applicable to, for example, the controller, the model, the tuning/shaping circuits discussed with respect to the various figures and may be used to implement the various methods described herein. It will be appreciated that specific implementations of these devices may be of differing possible specific computing architectures, not all of which are specifically discussed herein but will be understood by those of ordinary skill in the art. It will further be appreciated that the computer system may be considered and/or include an ASIC, FPGA, microcontroller, or other computing arrangement. In such various possible implementations, more or fewer components discussed below may be included, interconnections and other changes made, as will be understood by those of ordinary skill in the art.

The computer system 1400 may be a computing system that is capable of executing a computer program product to execute a computer process. Data and program files may be input to the computer system 1400, which reads the files and executes the programs therein. Some of the elements of the computer system 1400 are shown in FIG. 14, including one or more hardware processors 1402, one or more data storage devices 1404, one or more memory devices 1406, and/or one or more ports 1408-1412. Additionally, other elements that will be recognized by those skilled in the art may be included in the computing system 1400 but are not explicitly depicted in FIG. 14 or discussed further herein. Various elements of the computer system 1400 may communicate with one another by way of one or more communication buses, point-to-point communication paths, or other communication means not explicitly depicted in FIG. 14. Similarly, in various implementations, various elements disclosed in the system may or not be included in any given implementation.

The processor 1402 may include, for example, a central processing unit (CPU), a microprocessor, a microcontroller, a digital signal processor (DSP), and/or one or more internal levels of cache. There may be one or more processors 1402, such that the processor 1402 comprises a single central-processing unit, or a plurality of processing units capable of executing instructions and performing operations in parallel with each other, commonly referred to as a parallel processing environment.

The presently described technology in various possible combinations may be implemented, at least in part, in software stored on the data stored device(s) 1404, stored on the memory device(s) 1406, and/or communicated via one or more of the ports 1408-1412, thereby transforming the computer system 1400 in FIG. 14 to a special purpose machine for implementing the operations described herein.

The one or more data storage devices 1404 may include any non-volatile data storage device capable of storing data generated or employed within the computing system 1400, such as computer executable instructions for performing a computer process, which may include instructions of both application programs and an operating system (OS) that manages the various components of the computing system 1400. The data storage devices 1404 may include, without limitation, magnetic disk drives, optical disk drives, solid state drives (SSDs), flash drives, and the like. The data storage devices 1404 may include removable data storage media, non-removable data storage media, and/or external storage devices made available via a wired or wireless network architecture with such computer program products, including one or more database management products, web server products, application server products, and/or other additional software components. Examples of removable data storage media include Compact Disc Read-Only Memory (CD-ROM), Digital Versatile Disc Read-Only Memory (DVD-ROM), magneto-optical disks, flash drives, and the like. Examples of non-removable data storage media include internal magnetic hard disks, SSDs, and the like. The one or more memory devices 1406 may include volatile memory (e.g., dynamic random-access memory (DRAM), static random access memory (SRAM), etc.) and/or non-volatile memory (e.g., read-only memory (ROM), flash memory, etc.).

Computer program products containing mechanisms to effectuate the systems and methods in accordance with the presently described technology may reside in the data storage devices 1404 and/or the memory devices 1406, which may be referred to as machine-readable media. It will be appreciated that machine-readable media may include any tangible non-transitory medium that is capable of storing or encoding instructions to perform any one or more of the operations of the present disclosure for execution by a machine or that is capable of storing or encoding data structures and/or modules utilized by or associated with such instructions. Machine-readable media may include a single medium or multiple media (e.g., a centralized or distributed database, and/or associated caches and servers) that store the one or more executable instructions or data structures.

In some implementations, the computer system 1400 includes one or more ports, such as an input/output (I/O) port 1408, a communication port 1410, and a sub-systems port 1412, for communicating with other computing, network, or vehicle devices. It will be appreciated that the ports 1408-1412 may be combined or separate and that more or fewer ports may be included in the computer system 1400. The I/O port 1408 may be connected to an I/O device, or other device, by which information is input to or output from the computing system 1400. Such I/O devices may include, without limitation, one or more input devices, output devices, and/or environment transducer devices.

In one implementation, the input devices convert a human-generated signal, such as, human voice, physical movement, physical touch or pressure, and/or the like, into electrical signals as input data into the computing system 1400 via the I/O port 1408. In some examples, such inputs may be distinct from the various system and method discussed with regard to the preceding figures. Similarly, the output devices may convert electrical signals received from computing system 1400 via the I/O port 1408 into signals that may be sensed or used by the various methods and system discussed herein. The input device may be an alphanumeric input device, including alphanumeric and other keys for communicating information and/or command selections to the processor 1402 via the I/O port 1408.

The environment transducer devices convert one form of energy or signal into another for input into or output from the computing system 1400 via the I/O port 1408. For example, an electrical signal generated within the computing system 1400 may be converted to another type of signal, and/or vice-versa. In one implementation, the environment transducer devices sense characteristics or aspects of an environment local to or remote from the computing device 1400, such as battery voltage, open circuit battery voltage, charge current, battery temperature, light, sound, temperature, pressure, magnetic field, electric field, chemical properties, and/or the like.

In one implementation, a communication port 1410 may be connected to a network by way of which the computer system 1400 may receive network data useful in executing the methods and systems set out herein as well as transmitting information and network configuration changes determined thereby. For example, charging protocols may be updated, battery measurement or calculation data shared with external system, and the like. The communication port 1410 connects the computer system 1400 to one or more communication interface devices configured to transmit and/or receive information between the computing system 1400 and other devices by way of one or more wired or wireless communication networks or connections. Examples of such networks or connections include, without limitation, Universal Serial Bus (USB), Ethernet, Wi-Fi, Bluetooth®, Near Field Communication (NFC), Long-Term Evolution (LTE), and so on. One or more such communication interface devices may be utilized via the communication port 1410 to communicate with one or more other machines, either directly over a point-to-point communication path, over a wide area network (WAN) (e.g., the Internet), over a local area network (LAN), over a cellular (e.g., third generation (3G), fourth generation (4G), fifth generation (5G)) network, or over another communication means.

The computer system 1400 may include a sub-systems port 1412 for communicating with one or more systems related to a device being charged according to the methods and system described herein to control an operation of the same and/or exchange information between the computer system 1400 and one or more sub-systems of the device. Examples of such sub-systems of a vehicle, include, without limitation, motor controllers and systems, battery control systems, and others.

The system set forth in FIG. 14 is but one possible example of a computer system that may employ or be configured in accordance with aspects of the present disclosure. It will be appreciated that other non-transitory tangible computer-readable storage media storing computer-executable instructions for implementing the presently disclosed technology on a computing system may be utilized.

Embodiments of the present disclosure include various steps, which are described in this specification. The steps may be performed by hardware components or may be embodied in machine-executable instructions, which may be used to cause a general-purpose or special-purpose processor programmed with the instructions to perform the steps. Alternatively, the steps may be performed by a combination of hardware, software and/or firmware.

Various modifications and additions can be made to the exemplary embodiments discussed without departing from the scope of the present invention. For example, while the embodiments, also referred to as implementations or examples, described above refer to particular features, the scope of this invention also includes embodiments having different combinations of features and embodiments that do not include all of the described features. Accordingly, the scope of the present invention is intended to embrace all such alternatives, modifications, and variations together with all equivalents thereof.

While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to "one embodiment" or "an embodiment" means that a particular feature, structure, or characteristic described in connection with the embodiment is included in at least one embodiment of the disclosure. The appearances of the phrase "in one embodiment", or similarly "in one example" or "in one instance", in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims or can be learned by the practice of the principles set forth herein.

What is claimed is:

1. A controller for a battery comprising:

a processing unit;

a non-transitory computer-readable medium storing computer executable instructions which, when executed by the processing unit, cause the processing unit to:

execute a first model receiving a battery voltage measurement and a battery current measurement, and producing a predicted state of charge of the battery;

execute a second model receiving the battery voltage measurement and the battery current measurement, and producing a predicted battery temperature;

execute a third model receiving the battery voltage measurement and the battery current measurement, and producing a frequency based on an impedance assessment based on battery voltage measurement and the battery current measurement; and generate control signals for a charge signal circuit to generate a charge signal based on the predicted state of charge of the battery, the predicted battery temperature and the frequency.

2. The controller for the battery of claim 1 further comprising:

a fourth model producing a state of health metric from the impedance assessment.

3. The controller for the battery of claim 2 wherein the impedance assessment includes an equivalent circuit model of the battery, with the circuit model including an R value representing a battery cell bulk resistance and the state of health metric based on the R value.

4. The controller of claim 3 wherein the fourth model is a neural network receiving a component value from the equivalent circuit, the neural network producing the state of health metric.

5. The controller for the battery of claim 1 the computer executable instructions to further cause the processing unit to generate the charge signal based on accessing a preestablished battery charging constraint.

6. The controller for the battery of claim 5 wherein the preestablished battery charging constraint is set through a user interface.

7. The controller for the battery of claim 5 wherein the preestablished battery charging constraint is weighted.

8. The controller for the battery of claim 5 wherein the preestablished battery charging constraint is either a soft constraint that may be violated or a hard constraint that may not be violated.

9. The controller for the battery of claim 5 wherein the preestablished battery charging constraint comprises one or more of a battery temperature constraint, a charge rate constraint, a state of charge constraint, a battery capacity constraint, and a battery health constraint.

10. The controller for the battery of claim 1 the computer executable instructions further cause the processing unit to generate a mean current for the charge signal.

11. The controller for the battery of claim 10 wherein the first model further receives the mean current and the second model further receives the mean current.

12. The controller for the battery of claim 1 operably coupled with the charge signal circuit comprising a switch operably coupled with an inductor operably coupled with the battery, the switch generating a sequence of pulses at the inductor to form the charge signal based on the control signals for the charge signal circuit.

13. The controller for the battery of claim 1 wherein the charge signal is based on the frequency defines a shaped leading edge of the charge signal.

14. The controller for the battery of claim 13 operably coupled with the charge signal circuit comprising a switch operably coupled with an inductor operably coupled with the battery, the switch generating a sequence of pulses at the inductor to form the shaped leading edge of the charge signal based on the controls for the charge signal.

15. The controller for the battery of claim 13 wherein the the predicted battery temperature and the frequency are configured to generate a mean current of the charge signal based on executing a cost function.

16. The controller for the battery of claim 15 wherein the cost function is:

$$J = w_{soc} * J_1(I)^2 + w_T * J_2(I)^2; \text{ and}$$

$$J1 = SOC \text{ expected} - SOC\ (K+1)$$

$$J2 = T \text{ expected} - T\ (k+1).$$

17. A controller for a battery comprising:

a processing unit;

a non-transitory computer-readable medium storing computer executable instructions which, when executed by the processing unit, cause the processing unit to execute:

execute a battery state of charge model receiving a battery parameter, and producing a predicted state of charge of the battery;

execute a battery temperature model receiving the battery parameter, and producing a predicted battery temperature;

execute an impedance model receiving the battery parameter, and producing a frequency based on an impedance assessment using the battery parameter; and generate control signals for a charge signal circuit to generate a charge signal based on the predicted state of charge of the battery, the predicted battery temperature and the frequency.

18. The controller for the battery of claim 17 further comprising:

a fourth model producing a state of health metric from the impedance assessment.

19. The controller for the battery of claim 18 wherein the impedance assessment includes an equivalent circuit model of the battery, with the circuit model including an R value representing a battery cell bulk resistance and the state of health metric based on the R value.

20. The controller for the battery of claim 17 the computer executable instructions to further cause the processing unit to generate the charge signal based on accessing a preestablished battery charging constraint.

21. The controller for the battery of claim 20 wherein the preestablished battery charging constraint is set through a user interface.

22. The controller for the battery of claim 20 wherein the preestablished battery charging constraint is weighted.

23. The controller for the battery of claim 20 wherein the preestablished battery charging constraint is either a soft constraint that may be violated or a hard constraint that may not be violated.

24. The controller for the battery of claim 20 wherein the preestablished battery charging constraint comprises one or more of a battery temperature constraint, a charge rate constraint, a state of charge constraint, a battery capacity constraint, and a battery health constraint.

25. The controller for the battery of claim 17 the computer executable instructions further cause the processing unit to generate a mean current for the charge signal.

26. The controller for the battery of claim 25 wherein the battery state of charge model further receives the mean current and the battery temperature model further receives the mean current.

27. The controller for the battery of claim 17, wherein the charge signal circuit comprises a switch operably coupled with an inductor operably coupled with the battery, the switch generating a sequence of pulses at the inductor to form the charge signal based on the control signals for the charge signal circuit.

28. The controller for the battery of claim 17 wherein the battery parameter comprises at least one of a battery current measurement, a battery voltage measurement or a battery temperature measurement.

* * * * *